(12) United States Patent
Nakamura et al.

(10) Patent No.: US 6,914,368 B2
(45) Date of Patent: Jul. 5, 2005

(54) PIEZOELECTRIC RESONATOR, AND PIEZOELECTRIC FILTER, DUPLEXER, AND COMMUNICATION APPARATUS, ALL INCLUDING SAME

(75) Inventors: Daisuke Nakamura, Shiga-ken (JP); Yukio Yoshino, Otsu (JP); Masaki Takeuchi, Otsu (JP); Yoshihiko Gotoh, Shiga-ken (JP); Tadashi Nomura, Kyoto (JP); Ken-ichi Uesaka, Shiga-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 55 days.

(21) Appl. No.: 10/317,145

(22) Filed: Dec. 12, 2002

(65) Prior Publication Data

US 2003/0127945 A1 Jul. 10, 2003

(30) Foreign Application Priority Data

Jan. 8, 2002 (JP) ........................................ 2002-001330
Jul. 10, 2002 (JP) ........................................ 2002-201766

(51) Int. Cl.[7] .............................................. H01L 41/08
(52) U.S. Cl. ..................................... 310/365; 310/324
(58) Field of Search ................................ 310/322, 324, 310/366, 346

(56) References Cited

U.S. PATENT DOCUMENTS

| | | | | |
|---|---|---|---|---|
| 4,123,680 A | * | 10/1978 | Kemper et al. | 310/320 |
| 4,370,584 A | * | 1/1983 | Ikeno et al. | 310/365 |
| 5,274,297 A | | 12/1993 | Hermann et al. | |
| 5,789,845 A | * | 8/1998 | Wadaka et al. | 310/334 |
| 5,903,087 A | * | 5/1999 | Mattson et al. | 310/365 |
| 6,150,703 A | | 11/2000 | Cushman et al. | |
| 6,215,375 B1 | * | 4/2001 | Larson et al. | 333/187 |
| 6,448,699 B1 | * | 9/2002 | Scepanovic et al. | 310/365 |
| 6,525,449 B1 | * | 2/2003 | Wajima | 310/365 |
| 6,603,242 B2 | * | 8/2003 | Lee et al. | 310/365 |
| 6,667,566 B2 | * | 12/2003 | Kim et al. | 310/366 |
| 6,693,500 B2 | * | 2/2004 | Yang et al. | 333/189 |
| 2001/0054941 A1 | | 12/2001 | Shibata et al. | |

FOREIGN PATENT DOCUMENTS

| | | |
|---|---|---|
| EP | 1 041 717 A2 | 10/2000 |
| EP | 1 156 584 A1 | 11/2001 |
| EP | 1 170 862 A2 | 1/2002 |
| JP | 11-168343 | 6/1999 |
| JP | 2000-332568 | 11/2000 |
| JP | 2000-341077 | 12/2000 |
| JP | 2001-211052 | 8/2001 |
| JP | 2001-223556 | 8/2001 |
| JP | 2001-251159 | 9/2001 |
| JP | 2002-9579 | 1/2002 |
| JP | 2002-111435 | 4/2002 |
| WO | WO 02/43243 A1 | 5/2002 |
| WO | WO 02/103900 A1 | 12/2002 |

* cited by examiner

Primary Examiner—Mark Budd
(74) Attorney, Agent, or Firm—Keating & Bennett, LLP

(57) ABSTRACT

A piezoelectric resonator includes a substrate and a vibrator. The vibrator includes a thin-film portion having at least one piezoelectric thin-film layer disposed on the substrate and at least one pair of upper and lower electrodes disposed on the substrate. The vibrator has a structure in which the thin-film portion is sandwiched from the upper and lower surfaces thereof by the upper and lower electrodes, which oppose each other in the depth direction, and the overlapping portion of the vibrator defined by the opposing upper and lower electrodes has a tetragonal shape, when viewed in the depth direction, other than a rectangle and a square, the tetragonal shape having substantially parallel sides having a longitudinal length equal to or smaller than about 10 times the oscillatory wavelength and also having at least one portion in which the distance between opposing electrode edges varies.

27 Claims, 26 Drawing Sheets

7

PIEZOELECTRIC RESONATOR, AND PIEZOELECTRIC FILTER, DUPLEXER, AND COMMUNICATION APPARATUS, ALL INCLUDING SAME

BACKGROUND OF THE INVENTION

1. Field of the Invention

The present invention relates to piezoelectric resonators including a substrate and a vibrator having a structure in which a thin-film portion disposed on the substrate and having at least one piezoelectric thin-film layer is sandwiched between the upper and lower surfaces thereof by at least one pair of upper and lower electrodes disposed on the substrate and opposing each other in the depth direction. More particularly, the present invention relates to a piezoelectric resonator used, for example, as an oscillator for a mobile phone, a wireless LAN, or other apparatus or as an element for a filter or other device, and to a piezoelectric filter, a duplexer, and a communication apparatus, all including the piezoelectric resonator.

2. Description of the Related Art

In a piezoelectric resonator used in a thickness longitudinal oscillation mode, the lengths of opposing sides of an overlapping portion of upper and lower electrodes viewed in the depth direction, that is, when the shape of the overlapping portion of the upper and lower electrodes, which defines a vibrator, is simply a rectangle when viewed in the depth direction, the lengths of the two pairs of opposing sides of the rectangle determine the resonance frequencies of $S_n$ (n=0, 1, 2, 3, etc., where n is a nonnegative integer) oscillation modes. In particular, when the shape of a vibrator is a square when viewed in the depth direction, since the lengths of the two pairs of opposing sides are equal to each other, the resonance frequencies of the $S_n$ (n=0, 1, 2, 3, etc., where n is a nonnegative integer) oscillation modes determined by one pair of opposing sides are the same as those determined by the other pair of opposing sides.

When the shape of the overlapping portion of the upper and lower electrodes is a circle when viewed in the depth direction, since the relationships between the piezoelectric resonator and the oscillatory wavelengths are associated with the diameter of the circle, the resonance frequency of each of the $S_n$ (n=0, 1, 2, 3, etc., where n is a nonnegative integer) oscillation modes is determined for each integer n.

When the piezoelectric resonator has a rectangular overlapping portion, when viewed in the depth direction, which is formed by the upper and lower electrodes, since the length of one pair of opposing sides is different from that of the other pair of opposing sides, the resonance frequencies of the Sn oscillation modes determined by the length of one pair of opposing sides are different from those determined by the length of the other pair of opposing sides, thereby causing spurious oscillations to occur in the vicinities of a large number of resonance frequencies as a whole.

As a result, piezoelectric resonators in which the vibrator is a rectangle when viewed in the depth direction have not been generally used since it is believed that the spurious oscillations caused by the rectangular vibrator have much larger adverse effects than those caused by a square or circular vibrator.

Accordingly, piezoelectric resonators in which the vibrator is simply a square or a circle have been mainly used.

In the piezoelectric resonator in which the shape of the vibrator is a square or a circle as in the conventional manner, when the distance between the opposing sides or the diameter of vibrator is made large so as to obtain a large response of the main oscillation, the frequency width between the resonance point and the anti-resonance point in the frequency characteristics of the piezoelectric resonator widens in general, and accordingly, the piezoelectric resonator is likely to have a reduced Q factor. In other words, when the shape of the overlapping portion of the opposing electrodes is a circle or a square when viewed in the depth direction, as the size thereof becomes larger, the Q factor becomes smaller, thereby leading to an increase in losses of the piezoelectric resonator.

As disclosed, for example, by Japanese Unexamined Patent Application Publication No. 2002-009579, in a known piezoelectric resonator in which the shape of a vibrator is a circle or any shape including a circle therein when viewed in the depth direction and the relationship between the radius r and the thickness of the vibrator satisfies r≧20 t/n (n is a positive integer), the sizes of electrodes of the piezoelectric resonator become large. Also, the reduced Q factor of the piezoelectric resonator causes a problem in which the insertion loss of a filter formed by the piezoelectric resonator increases. FIG. 31 illustrates the phase and impedance characteristics of the known piezoelectric resonator vs. a frequency by way of example.

In this case, since spurious components produce a large number of ripples and also spurious components are produced close to its main oscillation in its frequency range, its resonant characteristics become less stable. For example, the spurious oscillations interfere with the main oscillation.

Also, as disclosed, for example, in Japanese Unexamined Patent Application Publication No. 2000-332568, a known piezoelectric resonator has a vibrator having a trapezoid shape so as to suppress an oscillation mode, appearing in a resonance frequency band of the thickness longitudinal oscillation, among higher harmonics involved in the lateral oscillation modes reflected at the ends of its electrodes.

However, in the piezoelectric resonator having such a vibrator, a diaphragm vibratably supporting the vibrator is required to be larger than a square circumscribing its electrodes. In addition, since the electrodes have irregular shapes, the diaphragm becomes larger than, for example, a square having the same area, thereby making it difficult to reduce the size of the piezoelectric resonator.

SUMMARY OF THE INVENTION

In order to overcome the problems described above, preferred embodiments of the present invention provide a piezoelectric resonator which minimizes the affect of spurious oscillations, in addition to providing a filter, a duplexer, and a communication apparatus, all including such a piezoelectric resonator.

A first piezoelectric resonator according to a preferred embodiment of the present invention includes a substrate and a vibrator, wherein the vibrator includes a thin-film portion having at least one piezoelectric thin-film layer disposed on the substrate, and at least one pair of upper and lower electrodes disposed on the substrate. The vibrator has a structure in which the thin-film portion is sandwiched between the upper and lower surfaces thereof by the upper and lower electrodes, which oppose each other in the depth direction. Also the overlapping portion of the vibrator defined by the opposing upper and lower electrodes preferably has a tetragonal shape, when viewed in the depth direction, other than a rectangle and a square, the tetragonal shape having substantially parallel sides having a longitudinal length that is substantially equal to or smaller than about 10 times the oscillatory wavelength and having at least one portion in which the distance between opposing electrode edges varies.

In the first piezoelectric resonator according to preferred embodiments of the present invention, the portion in which the distance between the opposing electrodes varies means a portion in which the shapes of the opposing electrodes corresponding to the shape of the vibrator, when viewed in the depth direction, have at least one pair of opposing sides which are not parallel to each other. In such a portion, the distance between the opposing sides varies continuously or partially discontinuously in directions along the sides. Also, when the shape of overlapping portion of the vibrator defined by the opposing upper and lower electrodes has at least two pairs of parallel sides, the distance between at least one pair of the parallel sides is preferably different from that between the other pair of the parallel sides.

In the first piezoelectric resonator according to a preferred embodiment of the present invention, the shape of the overlapping portion of the vibrator defined by the opposing upper and lower electrodes is a tetragon when viewed in the depth direction, other than a rectangle and a square, the tetragon having substantially parallel sides having a longitudinal length that is substantially equal to or smaller than about 10 times of the oscillatory wavelength and also having at least one portion in which the distance between opposing electrode edges varies. With this structure, since spurious components occurring at an angle with the longitudinal direction of the shape have smaller amplitudes compared to those occurring in a rectangle having the same area, the spurious components do not affect to the main oscillation as large ripples, thereby greatly improving the impedance characteristics and phase characteristics of the piezoelectric resonator.

A second piezoelectric resonator according to another preferred embodiment of the present invention includes a substrate and a vibrator which has a thin-film portion including at least one piezoelectric thin-film layer disposed on the substrate, and at least one pair of upper and lower electrodes disposed on the substrate. The vibrator has a structure in which the thin-film portion is sandwiched between the upper and lower surfaces thereof by the upper and lower electrodes, which oppose each other in the depth direction. Also, the overlapping portion of the vibrator defined by the opposing upper and lower electrodes has a polygonal shape having at least five sides, when viewed in the depth direction, the polygonal shape having substantially parallel sides having a longitudinal length that is substantially equal to or smaller than about 10 times the oscillatory wavelength and also having at least one portion in which the distance between opposing electrode edges varies.

In the second piezoelectric resonator according to a preferred embodiment of the present invention, the portion in which the distance between the opposing electrodes varies means a portion in which the shapes of the opposing electrodes corresponding to the shape of the vibrator, when viewed in the depth direction, have at least one pair of opposing sides which are not parallel to each other. In such a portion, the distance between the opposing sides varies continuously or partially discontinuously in directions along the sides.

In the second piezoelectric resonator according to a preferred embodiment of the present invention, the shape of the overlapping portion of the vibrator defined by the opposing upper and lower electrodes is a polygon having at least five sides when viewed in the depth direction, the polygon having substantially parallel sides having a longitudinal length that is substantially equal to or smaller than about 10 times of the oscillatory wavelength and also having at least one portion in which the distance between opposing electrode edges varies. With this structure, since spurious components occurring at an angle with the longitudinal direction of the shape have smaller amplitudes compared to those occurring in a rectangle having the same area, the spurious components do not affect to the main oscillation as large ripples, thereby greatly improving the impedance characteristics and phase characteristics of the piezoelectric resonator.

Experimental results obtained by the inventors reveal that the preferable length of the mutually parallel sides of the shape of the vibrator when viewed in the depth direction is substantially equal to or smaller than about 10 times the oscillatory wave length as in the first and second piezoelectric resonators according to preferred embodiments of the present invention. More particularly, the inventors prepared a large number of different shapes of samples having different ratios of the longitudinal lengths with respect to the oscillatory wavelength, measured spurious components occurring in these samples through experiment, and obtained experimental data shown in FIG. 32. Since a spurious component is evaluated by its impedance or phase, it is evaluated by its phase as shown in FIG. 32. When evaluated by the phase, the difference in a phase angle deviated from the main oscillation is evaluated. In other words, the smaller the difference in the phase angle, the smaller the spurious component. As seen in FIG. 32, it is revealed that, when the lengths of the substantially parallel sides of the shapes of the vibration are substantially equal to or smaller than about 10 times the oscillatory wavelength, the differences in relative phase angles are small, that is, equal to or smaller than about 15 degrees, concerning the relationships between the spurious occurrences and the phase angles deviated from the main oscillation. Accordingly, when the length of the substantially parallel sides of the shape of the vibrator when viewed in the depth direction is substantially equal to or smaller than about 10 times the oscillatory wavelength, the spurious components become small.

In the first or second piezoelectric resonator according to preferred embodiments of the present invention, the shape of the overlapping portion of the upper and lower electrodes of the vibrator is preferably symmetric with respect to a line or with respect to a point when viewed in the depth direction. In this case, since the vibrator has a systematical shape, the spurious components are likely to cancel out each other, thereby improving the impedance characteristics and the phase characteristics of the piezoelectric resonator.

In the second piezoelectric resonator according to a preferred embodiment of the present invention, the shape of the overlapping portion of the vibrator defined by the opposing upper and lower electrodes is preferably an octagon when viewed in the depth direction. With this structure, the piezoelectric resonator has excellent impedance characteristics and phase characteristics. Also, in this case, the shape of the overlapping portion of the vibrator defined by the opposing upper and lower electrodes is preferably a long octagon when viewed in the depth direction. Furthermore, in this case, when viewed in the depth direction, the overlapping portion of the vibrator defined by the opposing upper and lower electrodes may have a shape in which, when the lateral length is defined as b and the length of lateral sides at the longitudinal ends is defined as d, the relationship $d/b \leq 0.5$ is satisfied.

With this structure, occurrence or an affect of spurious components is minimized in comparison to the conventional structures, and accordingly, the piezoelectric resonator has even more excellent phase characteristics and impedance characteristics.

In the first piezoelectric resonator according to a preferred embodiment of the present invention, the shape of the overlapping portion of the vibrator defined by the opposing upper and lower electrodes is preferably a diamond or a trapezoid when viewed in the depth direction. With this structure, the piezoelectric resonator has excellent impedance characteristics and phase characteristics.

A third piezoelectric resonator according to a preferred embodiment of the present invention includes a substrate and a vibrator having a thin-film portion including at least one piezoelectric thin-film layer disposed on the substrate, and at least one pair of upper and lower electrodes disposed on the substrate. Also, the vibrator has a structure in which the thin-film portion is sandwiched between the upper and lower surfaces thereof by the upper and lower electrodes, which oppose each other in the depth direction. In addition, the overlapping portion of the vibrator defined by the opposing upper and lower electrodes has no pair of parallel sides and is symmetric with respect to a line when viewed in the depth direction.

In the third piezoelectric resonator according to a preferred embodiment of the present invention, since the vibrator has a systematical shape, spurious components cancel out each other, thereby improving the impedance characteristics and the phase characteristics of the piezoelectric resonator.

In the third piezoelectric resonator according to a preferred embodiment of the present invention, the shape of the overlapping portion of the vibrator defined by the opposing upper and lower electrodes is preferably an isosceles triangle or a heptagon when viewed in the depth direction. With this structure, the piezoelectric resonator has excellent impedance characteristics and phase characteristics.

In the first to third piezoelectric resonators according to preferred embodiments of the present invention, the overlapping portion of the vibrator defined by the opposing upper and lower electrodes may have a longitudinal length that is substantially equal to or greater than about 20 times the resonant wavelength of the main oscillation. With this structure, spurious components which occur depending on the longitudinal length are further reduced.

In the first to third piezoelectric resonators according to preferred embodiments of the present invention, the substrate may have an opening or a depression, and the vibrator is preferably disposed above the opening or the depression. With this structure, spurious components in the diaphragm-type piezoelectric resonator are greatly reduced.

In the first to third piezoelectric resonators according to preferred embodiments of the present invention, the vibrator may oscillate in a thickness longitudinal oscillation mode as a result of electrical signals supplied from the upper and lower electrodes. With this arrangement, spurious components in the piezoelectric resonator vibrating in a thickness longitudinal oscillation mode are greatly reduced. Also, in these piezoelectric resonators, since the spurious components do not affect to the main oscillation as large ripples, the impedance characteristics and phase characteristics of the piezoelectric resonators improve, whereby the piezoelectric resonators have excellent resonant characteristics.

A piezoelectric filter according to preferred embodiments of the present invention includes any one of the first to third piezoelectric resonators according to preferred embodiments of the present invention or has a ladder structure in which any one of the first to third piezoelectric resonators according to preferred embodiments of the present invention is used. Since spurious components in the piezoelectric resonator decrease, the piezoelectric filter having the above-described structure has excellent filter characteristics in which ripples caused by the spurious components are minimized. When the piezoelectric resonator is used as a part of the filter, ripples of signals in a frequency passing band caused by the spurious oscillations of the piezoelectric oscillator decrease, as a result, for example, a band-pass filter which is excellent in screening signals is obtained.

A duplexer according to another preferred embodiment of the present invention includes a piezoelectric resonator according to previously-described preferred embodiments of the present invention. Since spurious components in the piezoelectric resonator are minimized, the duplexer according to preferred embodiments of the present invention has excellent filter characteristics in which ripples caused by the spurious components are eliminated and minimized.

A communication apparatus according to another preferred embodiment of the present invention includes a piezoelectric resonator according to other preferred embodiments of the present invention. Since spurious components in the piezoelectric resonator are minimized, the communication apparatus according to preferred embodiments of the present invention has excellent characteristics.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
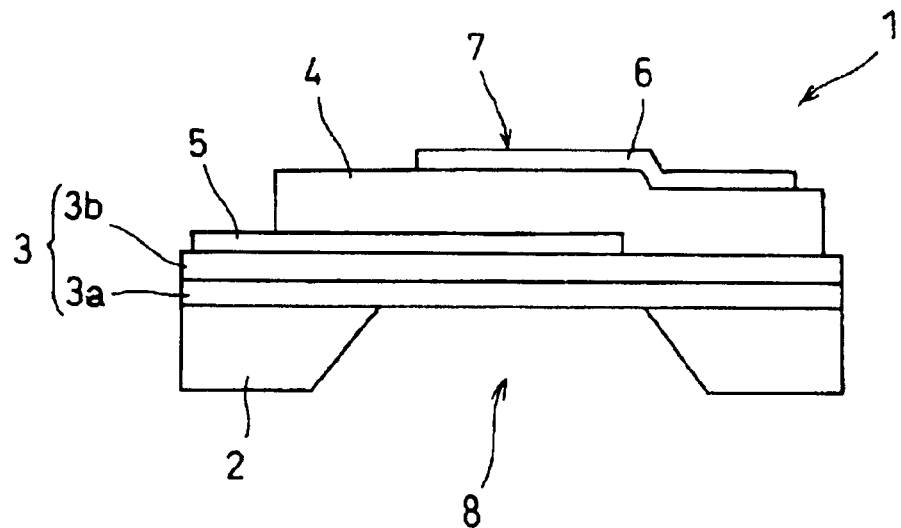
FIG. 1 is a vertical sectional view of an essential portion of a piezoelectric resonator according to first, and third to seventh preferred embodiments of the present invention.

Preferred embodiments of the present invention will be described in detail with reference to attached drawings.
First Preferred Embodiment FIGS. 1 and 2 are a schematic vertical sectional view and a schematic plane view of a piezoelectric resonator 1 according to a first preferred embodiment of the present invention.

The piezoelectric resonator 1 utilizes the second harmonic wave of a thickness longitudinal oscillation having a resonance frequency that is, for example, close to about 1.95 GHz. Of course, the piezoelectric resonator 1 may utilize the fundamental wave, the third harmonic wave, the fourth harmonic wave, or the n-th harmonic wave (n=5, 6, 7, etc., where n is a positive integer). The piezoelectric resonator 1 has a structure in which a supporting film 3, a piezoelectric thin-film 4, and thin films of electrodes 5 and 6 are arranged in a laminated manner on a substrate 2.

Figure 2:
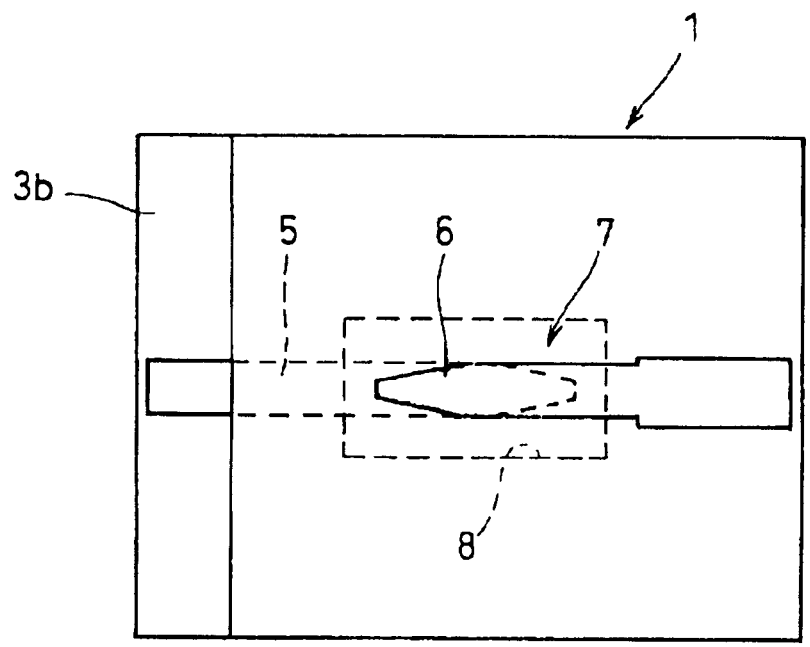
FIG. 2 is a plan view of the piezoelectric resonator according to the first preferred embodiment of the present invention.

More particularly, as shown in FIG. 1, the piezoelectric resonator 1 includes the substrate 2 having an opening 8, which has a substantially rectangular shape in plan view and which defines as a vibration space, the supporting film 3 disposed on the surface of the substrate 2, a lower electrode 5 disposed on the supporting film 3, the piezoelectric thin-film 4 disposed on the lower electrode 5, and an upper electrode 6 disposed on the piezoelectric thin-film 4.

The substrate 2 is preferably formed by a plate composed of silicon, Pyrex (a registered trademark) glass, quartz, or other suitable material. By removing a predetermined portion of the substrate 2 by, for example, etching, laser processing, or sand-blasting, the opening 8 is formed in the central portion of the substrate 2 so as to vertically extend therethrough so that a vibrator 7, which will be described later, can oscillate. In this preferred embodiment, the substrate 2 is preferably made of silicon.

The supporting film 3 supports the lower electrode 5, the piezoelectric thin-film 4, and the upper electrode 6, all disposed thereon, so as to define a vibratable diaphragm in the opening 8. More particularly, in this case, the supporting film 3 has a thin-film layer 3a, preferably made of silicon dioxide ($SiO_2$), arranged on the surface of the substrate 2 so as to cover the opening 8, and a thin-film layer 3b, preferably made of aluminum trioxide ($Al_2O_3$), disposed on the thin-film layer 3a. The supporting film 3 may be composed of, for example, silicon nitride (SiN), aluminum nitride, or other suitable material instead of silicon dioxide. In particular, preferably the supporting film 3 has a multilayer structure having at least two layers and containing opposite stresses, i.e., compressive stress and tensile stress.

The thin-film lower electrode 5 preferably made of aluminum is first formed on the supporting film 3.

The piezoelectric thin-film 4 preferably made of zinc oxide (ZnO) is formed on the lower electrode 5 and the supporting film 3. The piezoelectric thin-film 4 may be made of aluminum nitride (AlN), PZT, or other suitable material. Also, the piezoelectric thin-film 4 includes at least one piezoelectric thin-film layer, and it may be formed only by a piezoelectric element or may include at least one piezoelectric thin-film layer and, for example, an insulating film layer which is different from the piezoelectric thin-film.

The thin-film upper electrode 6 is formed on the upper surface of the piezoelectric thin-film 4 so as to overlap a portion of the lower electrode 5 when viewed in the depth direction. The upper electrode 6 is preferably made of aluminum in the same fashion as the lower electrode 5. The lower electrode 5 and the upper electrode 6 may be preferably made of gold (Au), silver (Ag), copper (Cu), platinum (Pt), nickel (Ni), or other suitable material, instead of aluminum.

The piezoelectric resonator 1 is sealed in a state in which the lower electrode 5 and the upper electrode 6 are connected to corresponding external electrodes.

The shape of an overlapping portion formed by the opposing lower and upper electrodes 5 and 6 is a long, narrow octagon (a long octagon) when viewed in the depth direction, as shown in FIG. 2. That is, the lower electrode 5 has a shape formed by cutting both corners of each long side of a rectangle, and the upper electrode 6 has a shape formed also by cutting both corners of each short side of a rectangle, thereby resulting in a long, narrow octagonal shape of the overlapping portion formed by these electrodes. By forming the upper electrode 6 so as to have the above-described shape, wires can be made thick, thereby allowing the resonator to have an improved Q factor because of the reduced resistance of the wires, and further providing improved filtering characteristics. The shape of the overlapping portion is formed by cutting a pair of corners at each longitudinal end of a long, narrow rectangle at an angle. The shape of the overlapping portion when viewed in the depth direction is symmetric with respect to a line relative to the virtual center line extending through the longitudinal center of the overlapping portion and also being substantially perpendicular to the longitudinal direction of the same.

The piezoelectric thin-film 4 oscillates due to the piezoelectric effect in this overlapping portion as a result of high-frequency signals supplied from the lower electrode 5 and the upper electrode 6. Hereinafter, a portion defined by the upper electrode 6, the lower electrode 5, the piezoelectric thin-film 4, and a portion, vibrating due to the piezoelectric effect, of the supporting film 3 disposed below the lower electrode 5 is called a vibrator 7.

The vibrator 7 having a long, narrow octagonal shape when viewed in the depth direction has a longitudinal length a which is preferably equal to or greater than about 20λ, i.e., about 20 times the oscillatory wavelength λ of the main oscillation ($S_0$ mode), as shown in FIGS. 1 and 2. A lateral length b that is substantially perpendicular to the longitudinal direction may be equal to or smaller than about 5λ, i.e., about 5 times the oscillatory wavelength λ of the main oscillation, or may be greater than about 5λ.

The longitudinal length a of the vibrator 7 is more preferably equal to or greater than about 80λ, i.e., about 80 times the oscillatory wavelength λ of the main oscillation.

The upper limit of the longitudinal length a of the vibrator 7 is set in accordance with the resonant wavelength of the main oscillation and the size of a chip in the piezoelectric resonator 1, and the lower limit of the lateral length b of the vibrator 7 is almost the same as the oscillatory wavelength λ of the main oscillation.

Experimental data of the specific characteristics of the piezoelectric resonator, in which the vibrator is formed so as to have a long, narrow octagonal shape when viewed in the depth direction, measured by the inventors while using Samples of the vibrator shown in FIGS. 4A to 8A are shown in FIGS. 4B to 8B.

Figure 3:
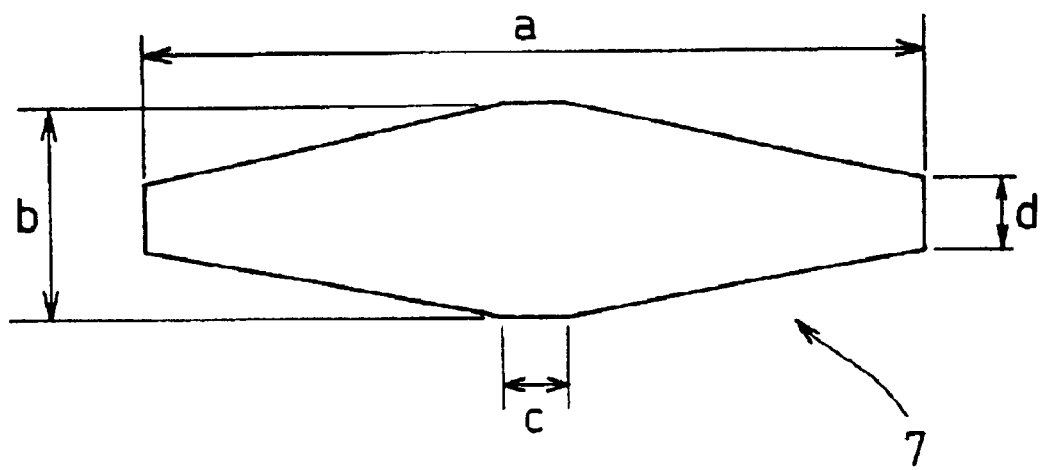
FIG. 3 is a plan view of an octagonal vibrator, when viewed in the depth direction, of the piezoelectric resonator according to the first preferred embodiment of the present invention.

FIG. 3 indicates the way of measuring the dimensions of the vibrator. More particularly, the longitudinal length and the lateral length of the vibrator having a long, narrow octagonal shape when viewed in the depth direction are defined as a and b, and the length of two sides extending along the longitudinal direction and the length of two sides extending along the lateral direction of the vibrator are defined as c and d. Each pair of opposing parallel sides preferably has substantially the same length.

The dimensions and the ratios d/b of Samples of the vibrator shown in FIGS. 4A to 8A are shown in Table 1. In the table, each dimension is represented by the ratio with respect to the oscillatory wavelength of the main resonance frequency.

TABLE 1

|  | a | B | c | c | d/b |
|---|---|---|---|---|---|
| Sample 1 | 63.9 | 26.7 | 3.2 | 6.4 | 0.239 |
| Sample 2 | 63.9 | 26.7 | 6.8 | 5.0 | 0.187 |
| Sample 3 | 74.8 | 20.5 | 6.8 | 6.8 | 0.332 |
| Sample 4 | 74.8 | 26.7 | 3.2 | 1.3 | 0.049 |
| Sample 5 | 87.2 | 20.5 | 6.8 | 3.1 | 0.151 |

Figure 4A:
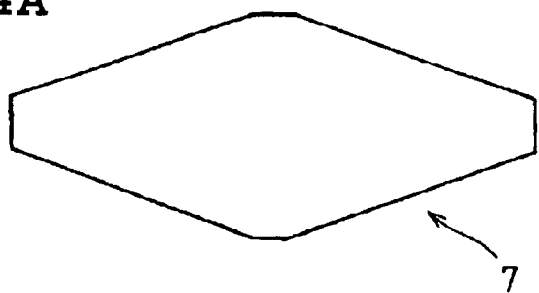
FIGS. 4A and 4B are a plan view of Sample 1 of the vibrator of the piezoelectric resonator according to the first preferred embodiment of the present invention and a graph illustrating the resonant characteristics of Sample 1, respectively.
Figure 4B:
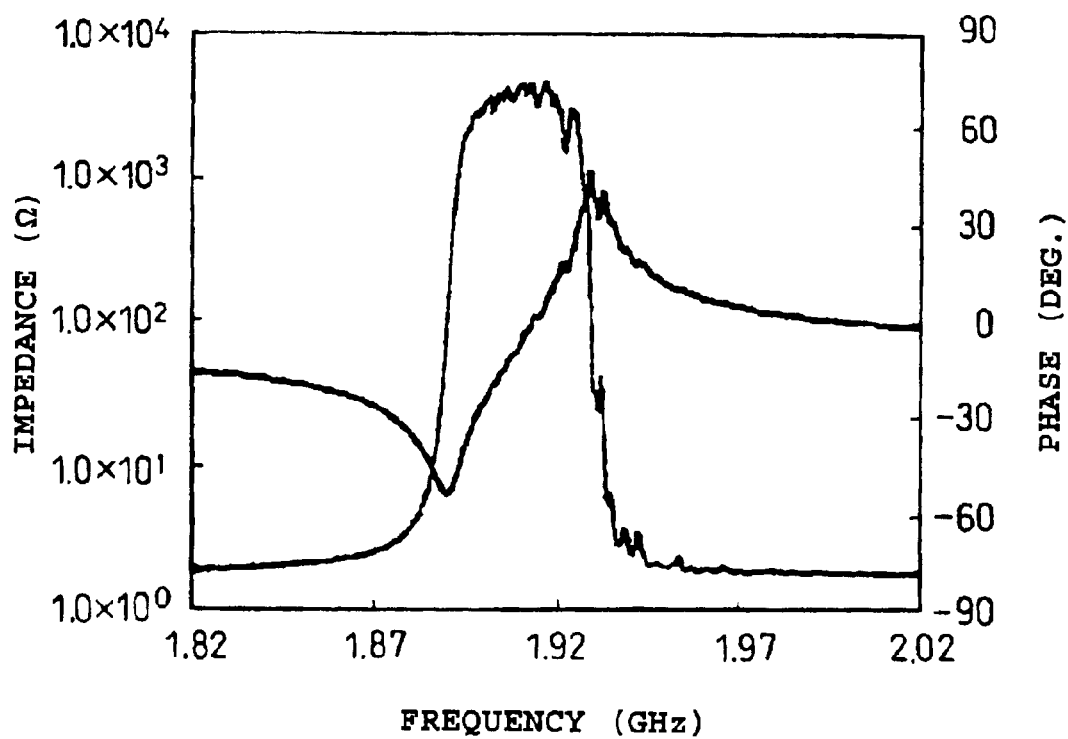
Figure 5A:
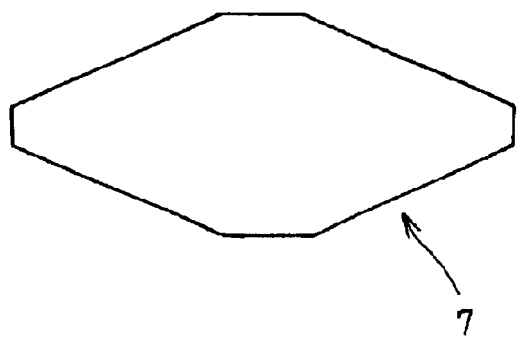
FIGS. 5A and 5B are a plan view of Sample 2 of the vibrator of the piezoelectric resonator according to the first preferred embodiment of the present invention and a graph illustrating the resonant characteristics of Sample 2, respectively.
Figure 5B:
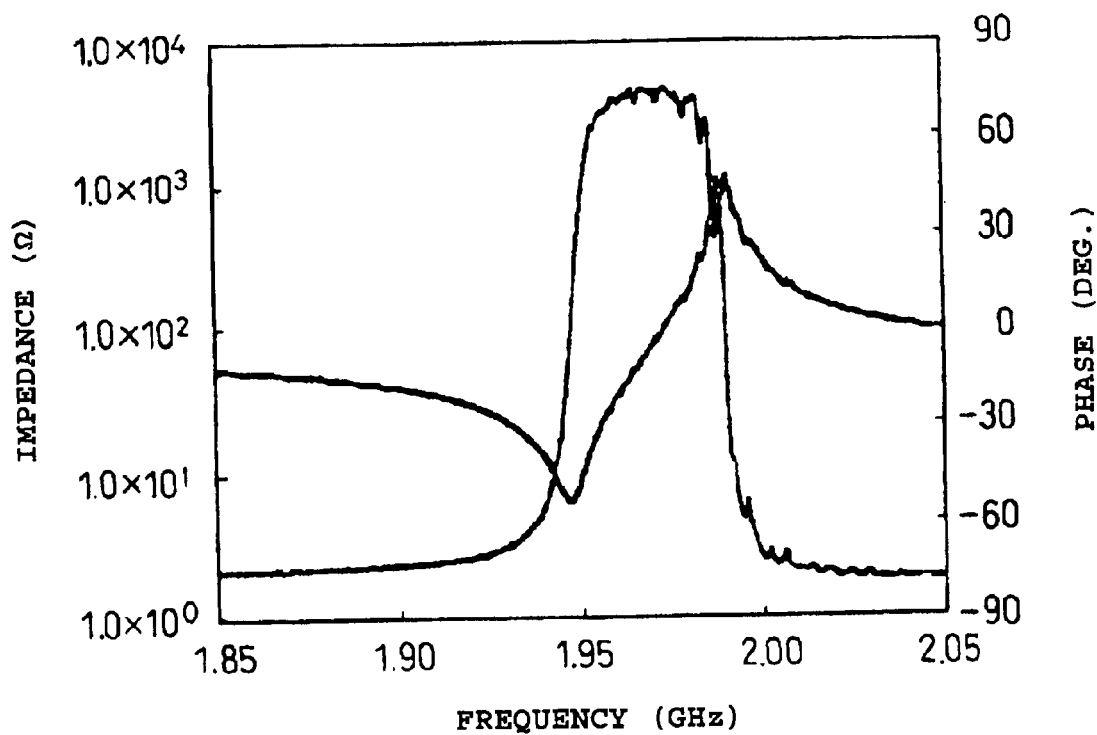
Figure 6A:
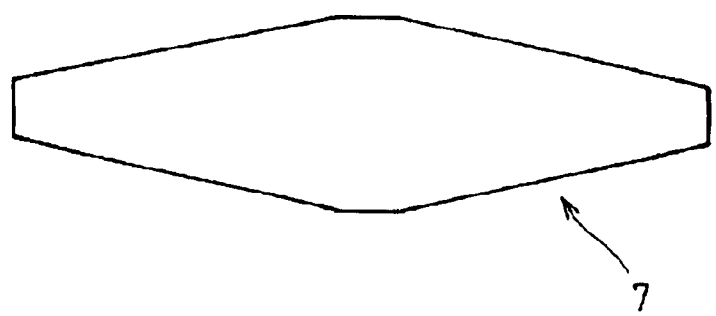
FIGS. 6A and 6B are a plan view of Sample 3 of the vibrator of the piezoelectric resonator according to the first preferred embodiment of the present invention and a graph illustrating the resonant characteristics of Sample 3, respectively.
Figure 6B:
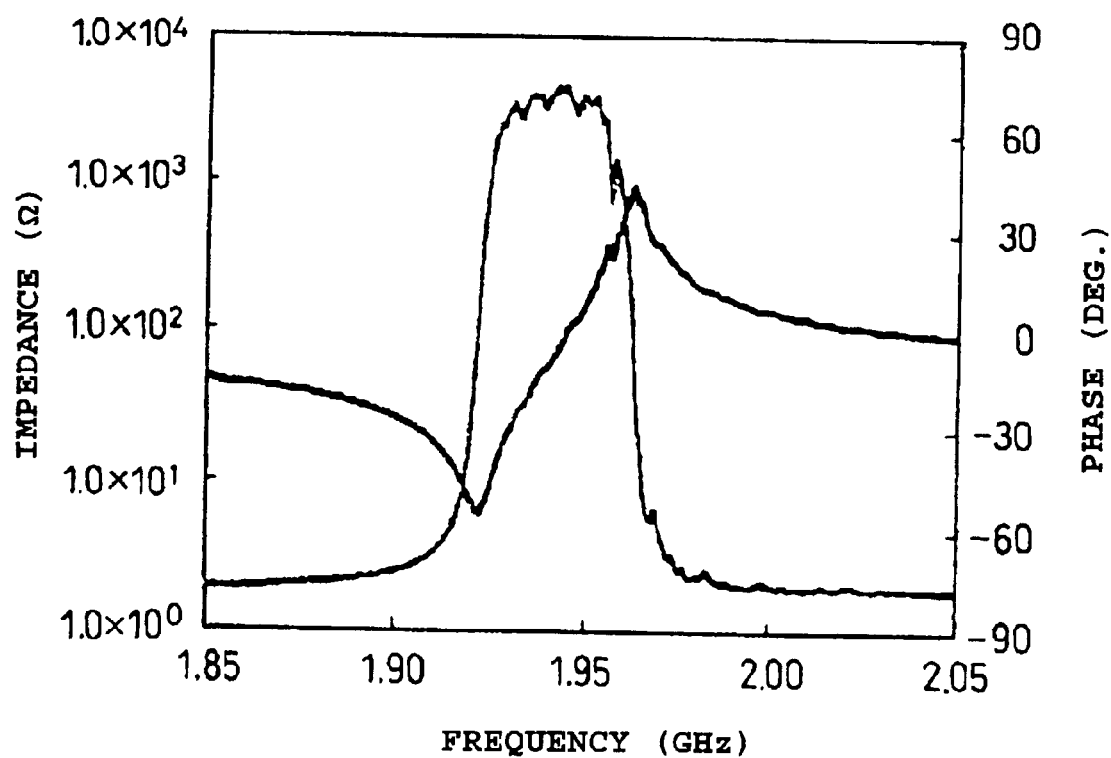
Figure 7A:
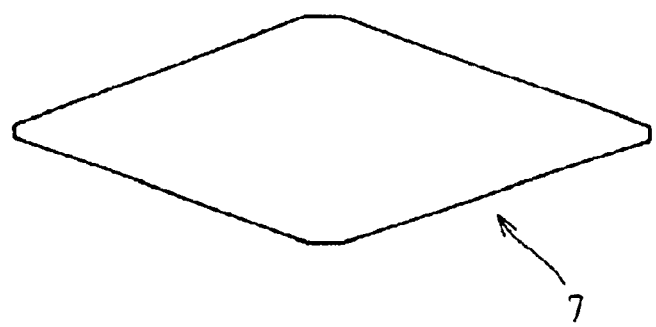
FIGS. 7A and 7B are a plan view of Sample 4 of the vibrator of the piezoelectric resonator according to the first preferred embodiment of the present invention and a graph illustrating the resonant characteristics of Sample 4, respectively.
Figure 7B:
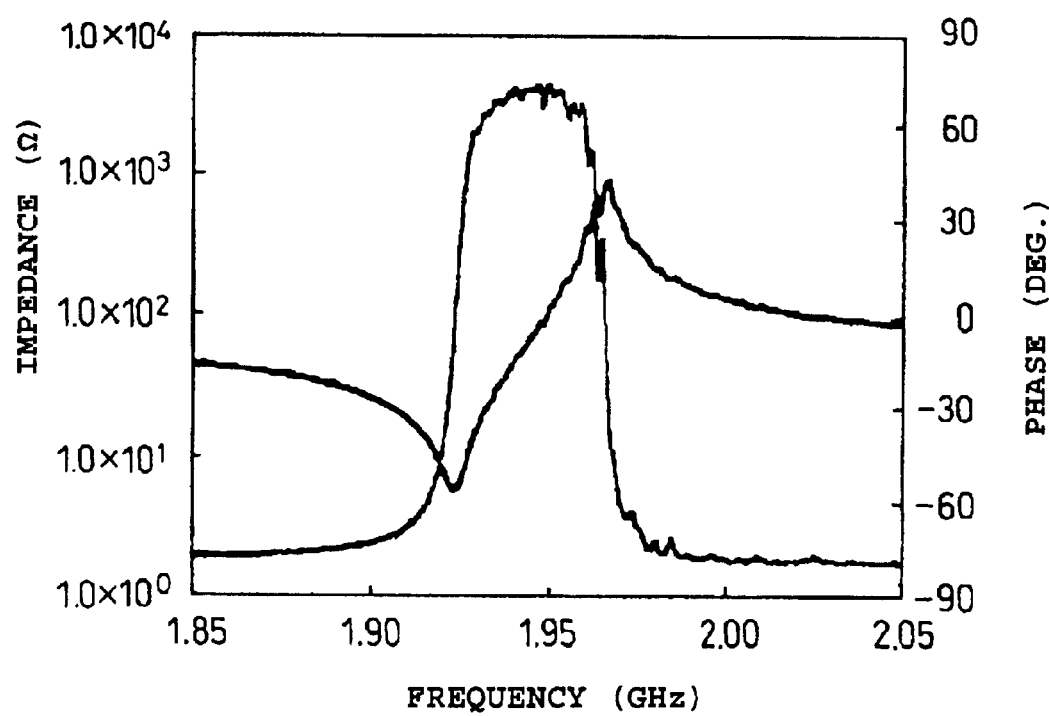
Figure 8A:
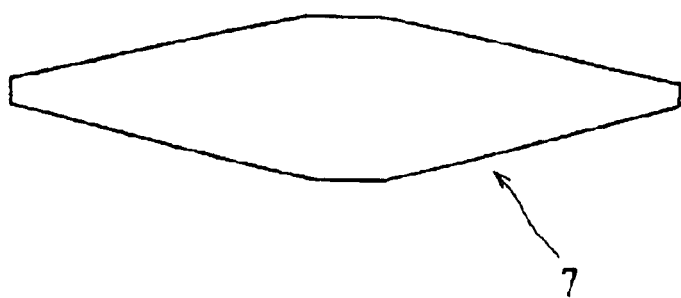
FIGS. 8A and 8B are a plan view of Sample 5 of the vibrator of the piezoelectric resonator according to the first preferred embodiment of the present invention and a graph illustrating the resonant characteristics of Sample 5, respectively.
Figure 8B:
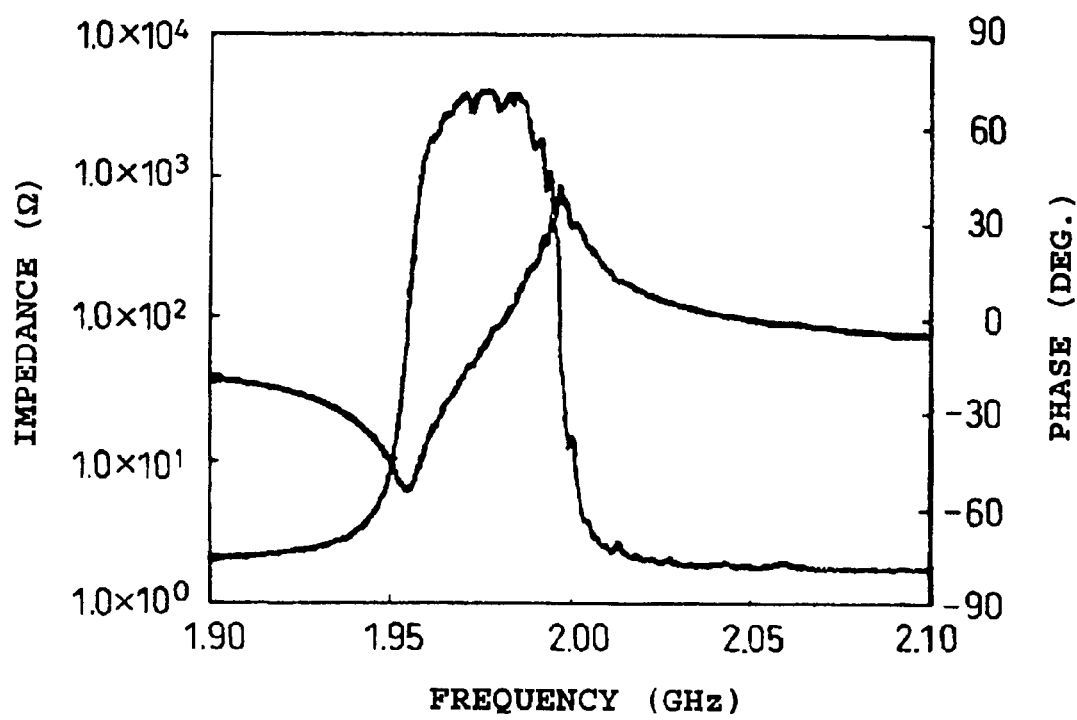

FIG. 4A illustrates the shape of Sample 1 in Table 1 when viewed in the depth direction and FIG. 4B shows its measured impedance characteristics and phase characteristics. Likewise, FIGS. 5A to 8A illustrate the shapes of Samples 2 to 8 when viewed in the depth direction, respectively, and FIGS. 5B to 8B show their measured impedance characteristics and phase characteristics, respectively.

In the piezoelectric resonator using each of the samples shown in FIGS. 4A to 8A, the length of each pair of substantially parallel sides is preferably equal to or smaller than about 10 times the oscillatory wavelength, and the distance between any opposing electrode edges, which will be described later, other than the two pairs of substantially parallel sides, varies in the longitudinal direction or in the lateral direction. Also, when at least two pairs of substantially parallel sides of the electrode edges define the shape of the vibrator of the overlapping portion defined by the opposing upper and lower electrodes, the distance between at least one pair of the substantially parallel sides, i.e., the distance between the electrode edges corresponding to these substantially parallel sides, is different from the distance between the other substantially parallel sides, i.e., the distance between the electrode edges corresponding to these substantially parallel sides. This arrangement leads to reduction in spurious components caused by oscillations between the electrode edges. The ratio d/b of each sample is preferably equal to or smaller than about 0.5, thereby leading to further elimination and minimizing of spurious components.

Second Preferred Embodiment

Figure 9:
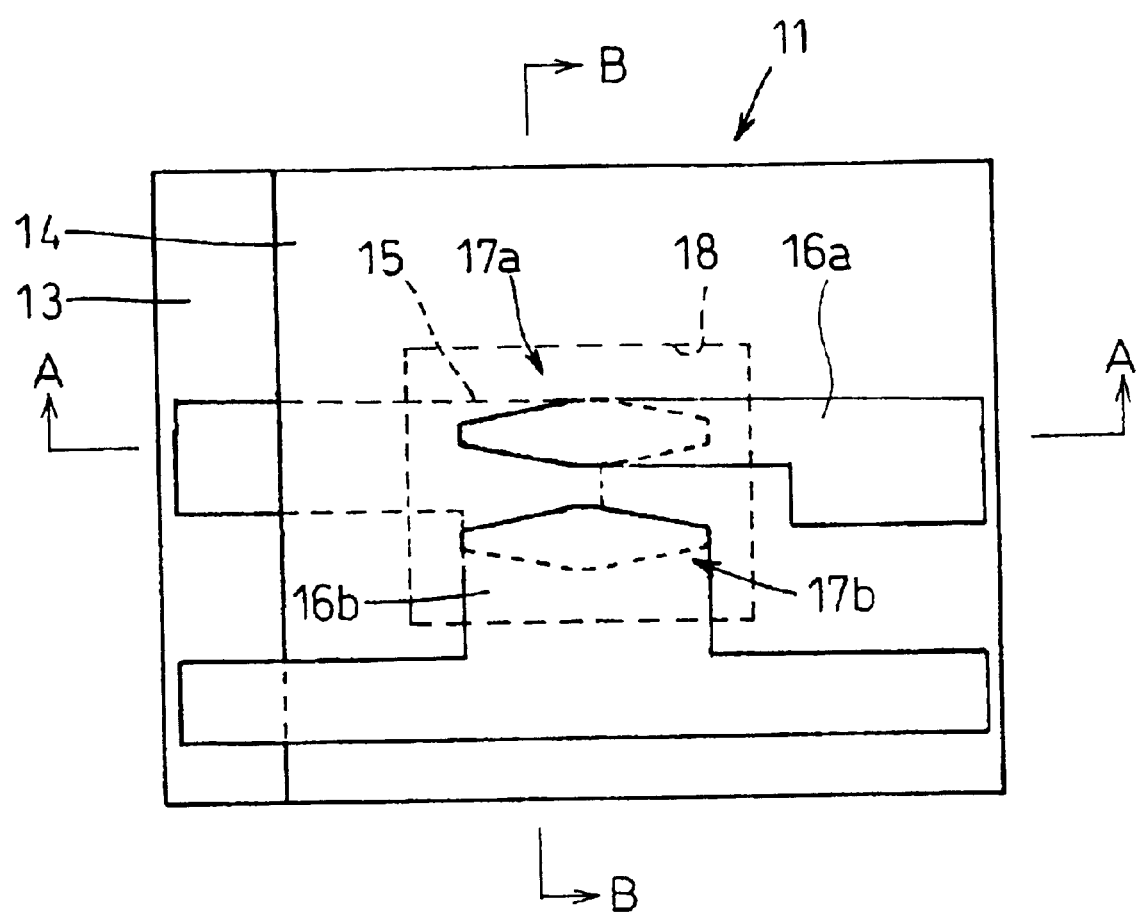
FIG. 9 is a plan view of a piezoelectric filter according to a second preferred embodiment of the present invention.
Figure 10A:
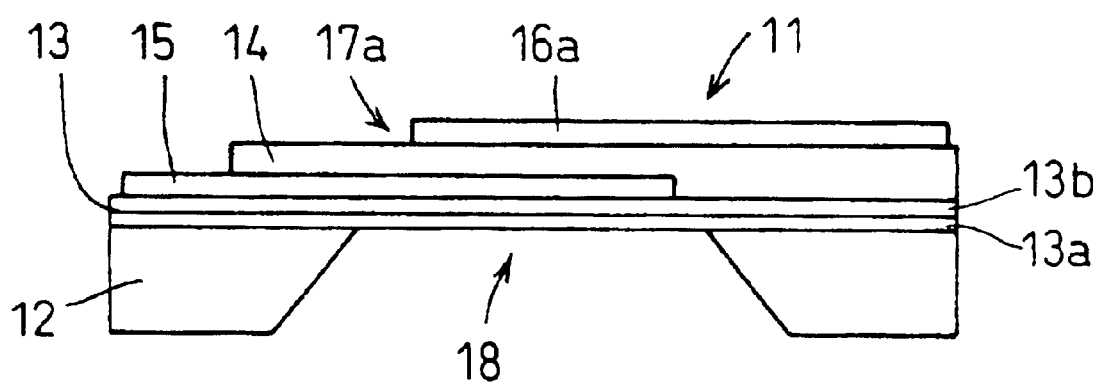
FIGS. 10A and 10B are sectional views taken along the lines A—A and B—B indicated in FIG. 9, respectively.
Figure 10B:
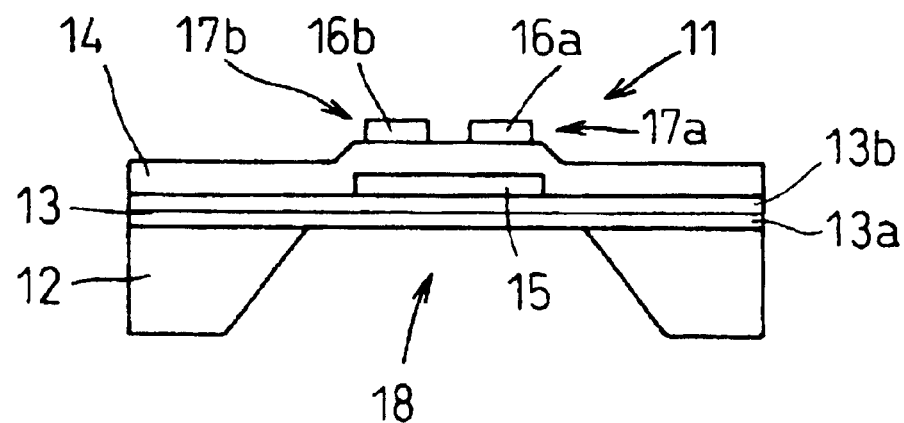
Figure 11:
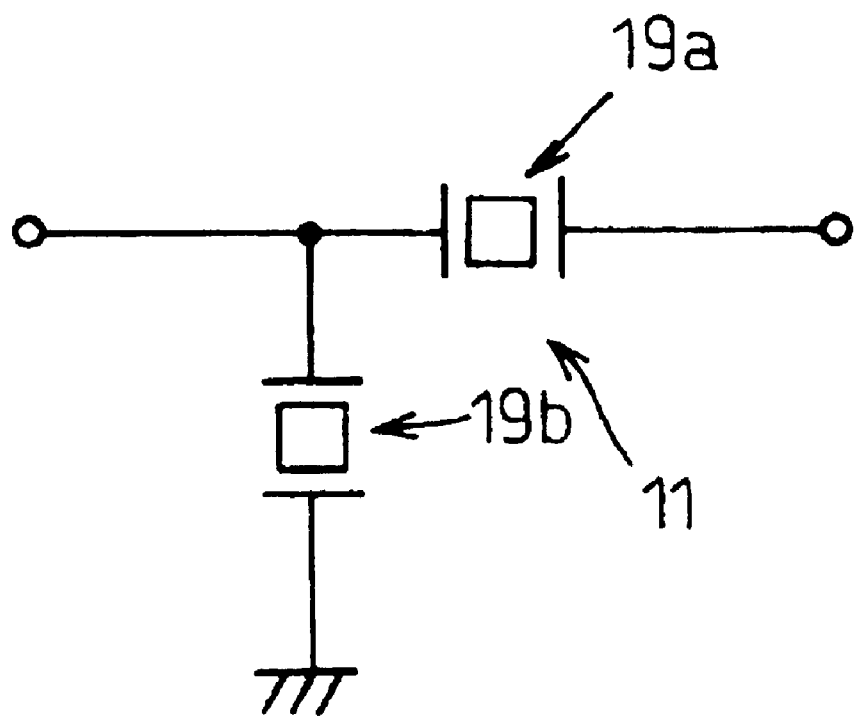
FIG. 11 is a circuit diagram representing the piezoelectric filter shown in FIG. 9.

Referring now to FIGS. 9 to 11, an example filter, according to a second preferred embodiment of the present invention, including the piezoelectric resonator according to various preferred embodiments of the present invention, will be described. FIGS. 9 to 11 illustrate an L-type ladder filter 11 in which one piezoelectric resonator is connected in series between input and output terminals and another piezoelectric resonator is connected in parallel between the input terminal and a grounding terminal.

As shown in FIG. 9, the ladder filter 11 preferably has a single chip structure. More particularly, the ladder filter 11 has a substrate 12 made of silicon in the same manner as in the foregoing first preferred embodiment, an opening 18 formed in the substrate 12 and defining as a vibration space, and a supporting film 13 made of silicon dioxide and disposed on the surface of the substrate 12 so as to cover the opening 18. Also, the ladder filter 11 has a lower electrode 15 disposed on the supporting film 13, and a piezoelectric thin film 14, made of zinc oxide (ZnO) and functioning as a piezoelectric vibration element, arranged in a laminated manner on the lower electrode 15 and the supporting film 13. The supporting film 13 is defined by a thin-film layer 13a, made of silicon dioxide ($SiO_2$), disposed on the surface of the substrate 12 so as to cover the opening 18 and a thin-film layer 13b, made of aluminum trioxide ($Al_2O_3$), disposed on the thin-film layer 13a. In addition, the ladder filter 11 has upper electrodes 16a and 16b disposed on the upper surface of the piezoelectric thin film 14 so as to partially overlap the lower electrode 15 when viewed in the depth direction. The shapes of the overlapping portions, when viewed in the depth direction, between the lower electrode 15 and the upper electrode 16a and between the lower electrode 15 and the upper electrode 16b are long octagons. Thus, the overlapping portion between the lower electrode 15 and the upper electrode 16a defines one series piezoelectric resonator 19a and the other overlapping portion between the lower electrode 15 and the upper electrode 16b defines another parallel piezoelectric resonator 19b.

The overlapping portion, including the piezoelectric thin-film 14, disposed between the lower electrode 15 and the upper electrode 16a when viewed in the depth direction defines a vibrator 17a which oscillates due to the piezoelectric effect as a result of high-frequency signals supplied from the lower electrode 15 and the upper electrode 16a. Likewise, the overlapping portion, including the piezoelectric thin-film 14, disposed between the lower electrode 15 and the upper electrode 16b when viewed in the depth direction defines a vibrator 17b which oscillates due to the piezoelectric effect as a result of high-frequency signals supplied from the lower electrode 15 and the upper electrode 16b.

The longitudinal lengths of the long octagons, when viewed in the depth direction, of the vibrator 17a and the vibrator 17b are preferably substantially equal to or greater than about 20 times the wavelength λ of the main resonance frequency, and the lateral lengths of the long octagons are preferably substantially equal to or smaller than about 5 times the wavelength λ of the main resonance frequency.

In the ladder filter 11 having the above-described structure, spurious components occurring in both piezoelectric resonators 19a and 19b decrease and accordingly ripples of the filtering characteristics of the filer decrease, resulting in improved filter characteristics.

Third Preferred Embodiment

Figure 12:
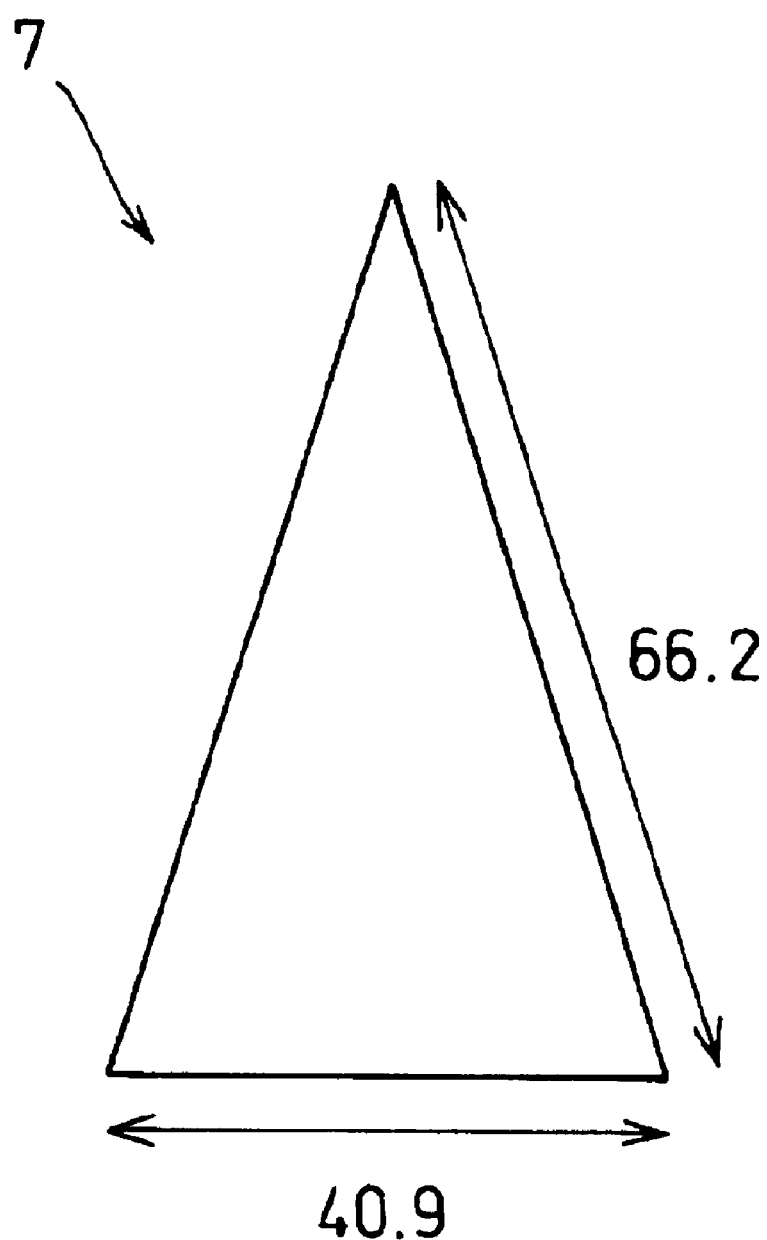
FIG. 12 is a plan view illustrating the shape of a vibrator of the piezoelectric resonator according to the third preferred embodiment of the present invention.
Figure 13:
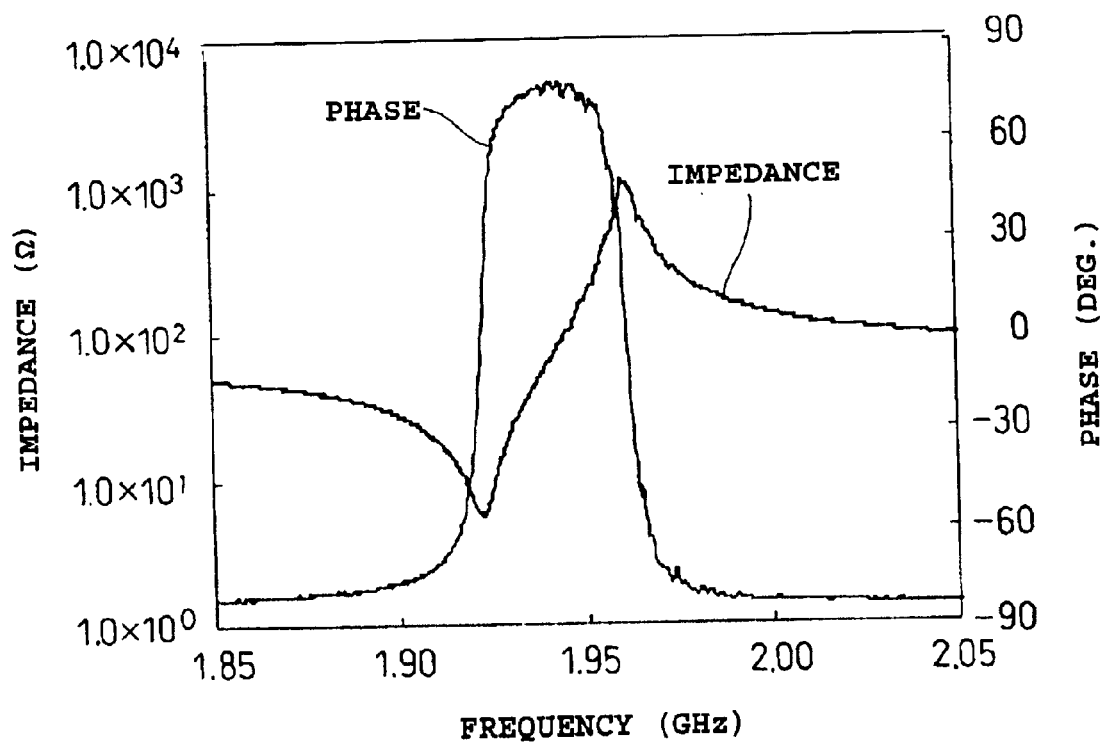
FIG. 13 is a graph illustrating the resonant characteristics of the piezoelectric resonator shown in FIG. 12.

Referring now to FIGS. 1, 12, and 13, a piezoelectric resonator according to a third preferred embodiment of the present invention will be described. The piezoelectric resonator according to the third preferred embodiment has the same structure as that in the first preferred embodiment, as shown in the vertical sectional view of FIG. 1. Therefore, the shape and the like of the vibrator 7 when viewed in the depth direction, which are different from those in the first preferred embodiment, will he described, and the description of the same structure as in the first preferred embodiment is omitted.

As shown in FIG. 12, the shape of the vibrator 7 of the piezoelectric resonator 1 is preferably an isosceles triangle when viewed in the depth direction. The lengths of the two equal sides and the base of the vibrator 7 are preferably about 66.2 times and about 40.9 times the wavelength of the main resonance frequency, respectively.

FIG. 13 is a graph illustrating the impedance characteristics and phase characteristics of the piezoelectric resonator 1. In this piezoelectric resonator 1, since the vibrator is an isosceles triangle when viewed in the depth direction and thus the distance between the opposing equal sides becomes smaller toward the top of the triangle, the distance between the electrode edges forming the vibrator and corresponding to the substantially equal sides varies along the equal sides. Accordingly, as shown in FIG. 13, since the vibrator 7 has a systematical shape, spurious components are likely to cancel out each other, thereby leading to improved impedance characteristics and phase characteristics of the piezoelectric resonator.

Fourth Preferred Embodiment

Figure 14:
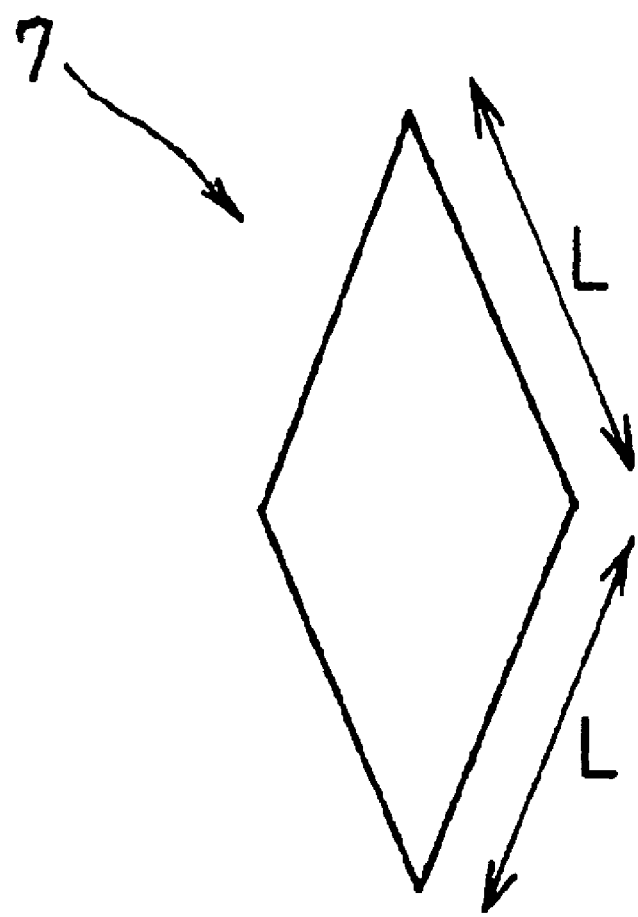
FIG. 14 is a plan view illustrating the shape of a vibrator of the piezoelectric resonator according to the fourth preferred embodiment of the present invention.
Figure 15:
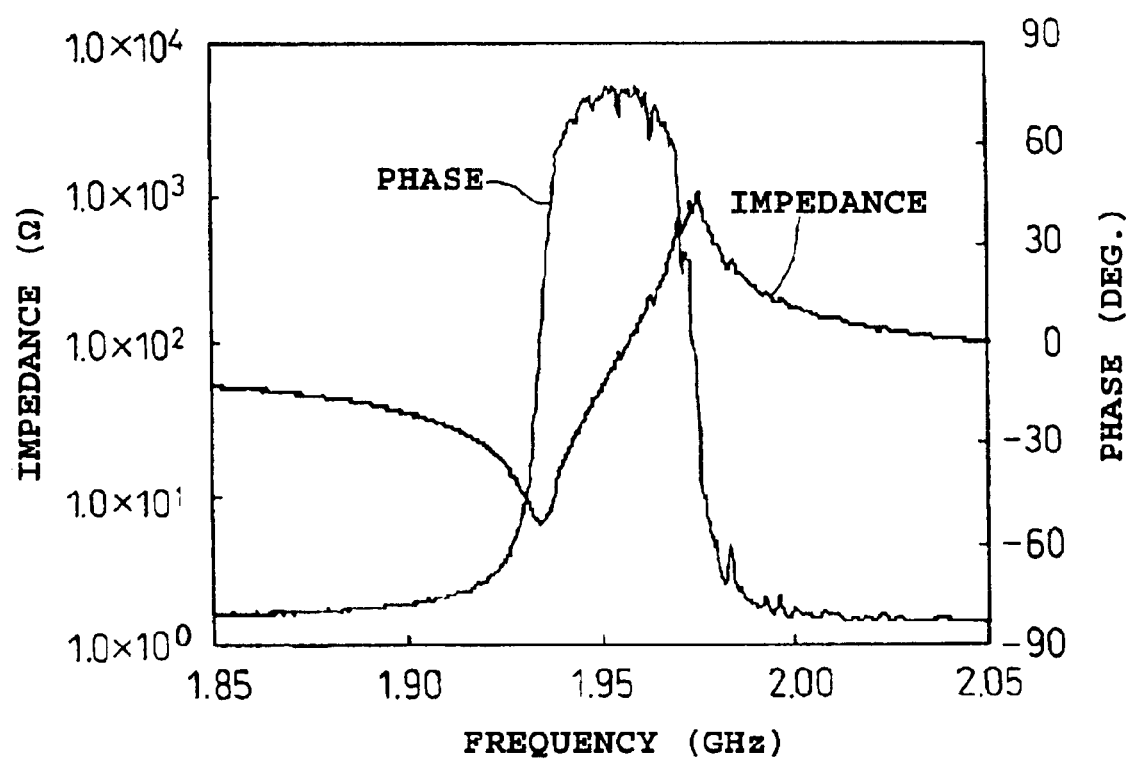
FIG. 15 is a graph illustrating the resonant characteristics of the piezoelectric resonator shown in FIG. 14.

Referring now to FIGS. 1, 14, and 15, a piezoelectric resonator according to a fourth preferred embodiment of the present invention will be described. The piezoelectric resonator according to the fourth preferred embodiment has substantially the same structure as that in the first preferred embodiment, as shown in the vertical sectional view of FIG. 1. Therefore, the shape and other characteristics of the vibrator 7 when viewed in the depth direction, which are different from those in the first preferred embodiment, will be described, and the description of the same structure as in the first preferred embodiment is omitted.

As shown in FIG. 14, the shape of the vibrator 7 of the piezoelectric resonator 1 is preferably a diamond-shape when viewed in the depth direction. The length L of two pairs of substantially parallel sides of the vibrator 7 is preferably substantially equal to or smaller than about 10 times the wavelength of the main resonance frequency.

FIG. 15 is a graph illustrating the impedance characteristics and phase characteristics of the piezoelectric resonator. As described above, since the shape of the vibrator 7 is a diamond-shape, when viewed in the depth direction, in which the length L of the opposing parallel sides is preferably equal to or smaller than about 10 times the oscillatory wavelength, the systematical shape of the vibrator allows spurious components to be decreased by canceling out each other, thereby leading to favorable characteristics of the piezoelectric resonator with minimal ripples, as shown in FIG. 15.

Fifth Preferred Embodiment

Figure 16:
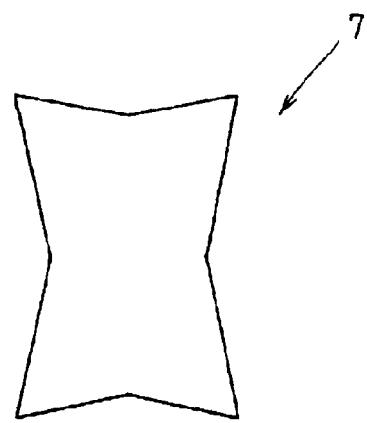
FIG. 16 is a plan view illustrating the shape of a vibrator of the piezoelectric resonator according to the fifth preferred embodiment of the present invention.
Figure 17:
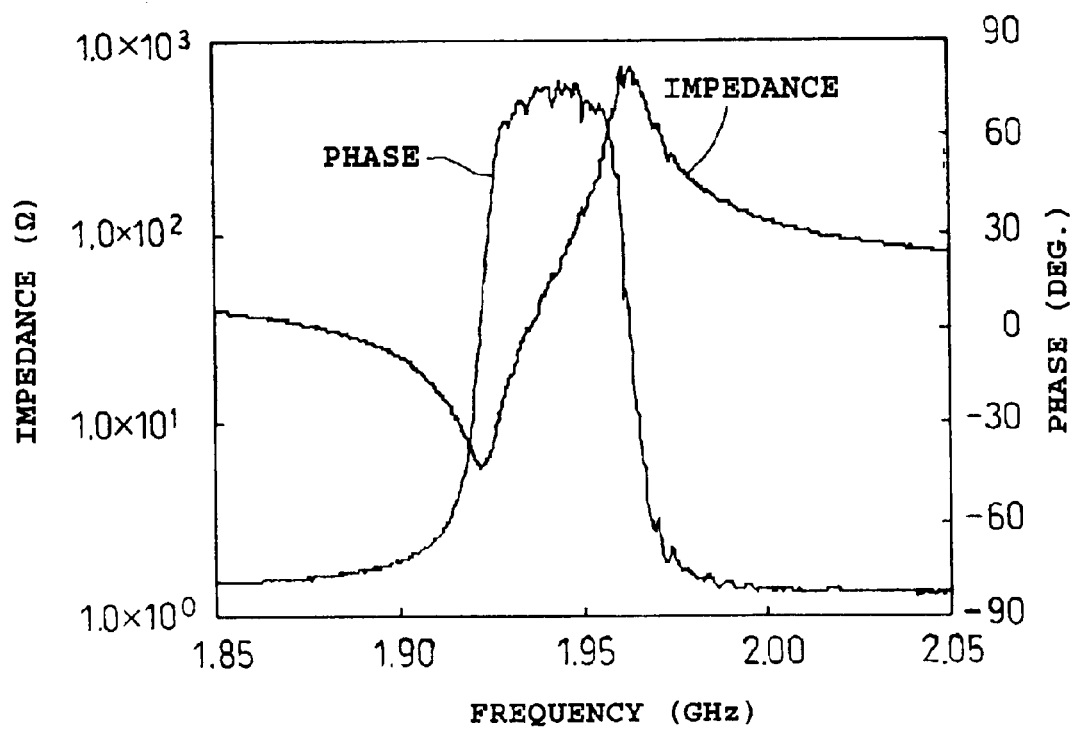
FIG. 17 is a graph illustrating the resonant characteristics of the piezoelectric resonator shown in FIG. 16.

Referring now to FIGS. 1, 16, and 17, a piezoelectric resonator according to a fifth preferred embodiment of the present invention will be described. The piezoelectric resonator according to the fifth preferred embodiment preferably has the same structure as that in the first preferred embodiment, as shown in the vertical sectional view of FIG. 1. Therefore, the shape and other characteristics of the vibrator 7 when viewed in the depth direction, which are different from those in the first preferred embodiment, will be described, and the description of the same structure as in the first preferred embodiment is omitted.

As shown in FIG. 16, when viewed in the depth direction, the shape of the vibrator 7 of the piezoelectric resonator 1 is preferably a symmetric octagon, with respect to a line, in which four pairs of adjacent sides form re-entrant angles and the other four pairs of adjacent sides form salient angles.

FIG. 17 is a graph illustrating the impedance characteristics and phase characteristics of the piezoelectric resonator. As described above, when viewed in the depth direction, since the vibrator 7 has a shape in which the distance between the opposing sides, i.e., the distance between the electrode edges corresponding to these sides varies in directions along the sides and also which forms a line symmetry, the systematical shape of the vibrator allows spurious components to be decreased by canceling out each other, thereby leading to favorable characteristics of the piezoelectric resonator with minimal ripples, as shown in FIG. 17.

Sixth Preferred Embodiment

Figure 18:
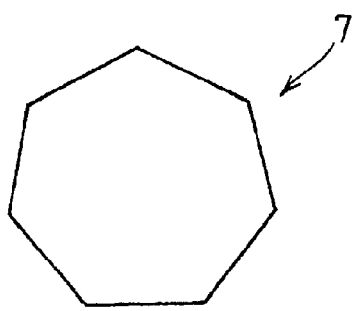
FIG. 18 is a plan view illustrating the shape of a vibrator of the piezoelectric resonator according to the sixth preferred embodiment of the present invention.
Figure 19:
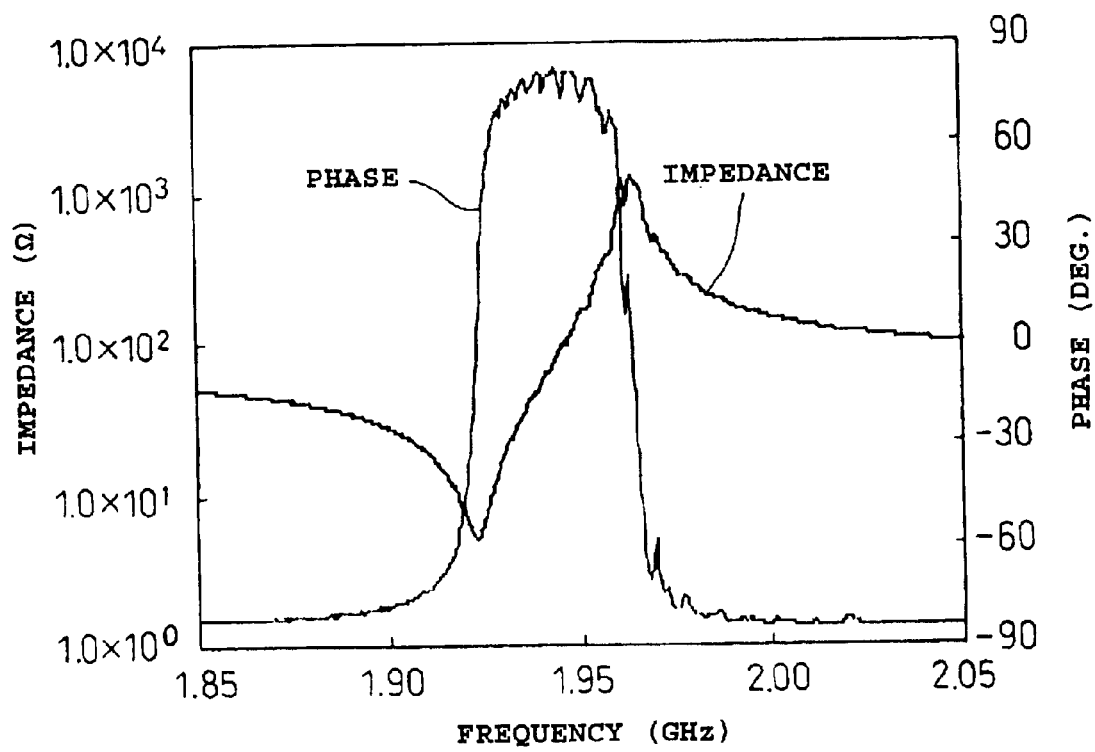
FIG. 19 is a graph illustrating the resonant characteristics of the piezoelectric resonator shown in FIG. 18.

Referring now to FIGS. 1, 18, and 19, a piezoelectric resonator according to a sixth preferred embodiment of the present invention will be described. The piezoelectric resonator according to the sixth preferred embodiment has the same structure as that in the first preferred embodiment, as shown in the vertical sectional view of FIG. 1. Therefore, the shape and other characteristics of the vibrator 7 when viewed in the depth direction, which are different from those in the first preferred embodiment, will be described, and the description of the same structure as in the first preferred embodiment is omitted.

As shown in FIG. 18, the shape of the vibrator 7 of the piezoelectric resonator 1 is preferably a hexagon which is symmetric with respect to a line when viewed in the depth direction.

FIG. 19 is a graph illustrating the impedance characteristics and phase characteristics of the piezoelectric resonator. As described above, since the shape of the vibrator 7 is a hexagon which is symmetric with respect to a line when viewed in the depth direction, no opposing sides are parallel to each other. Thus, since the distance between the opposing sides varies in directions along the sides, the distance between the electrode edges corresponding to these sides defining the vibrator varies along the sides and also since the vibrator 7 has a systematical shape because of its line symmetry, spurious components cancel out each other, thereby leading to improved impedance characteristics and phase characteristics of the piezoelectric resonator, as shown in FIG. 19.

Seventh Preferred Embodiment

Figure 20:
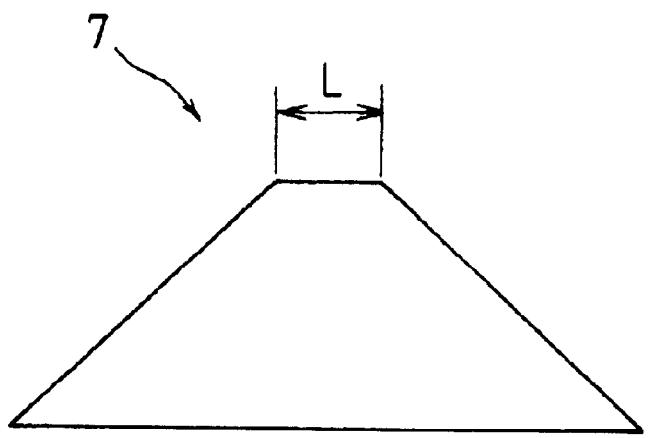
FIG. 20 is a plan view illustrating the shape of a vibrator of the piezoelectric resonator according to the seventh preferred embodiment of the present invention.
Figure 21:
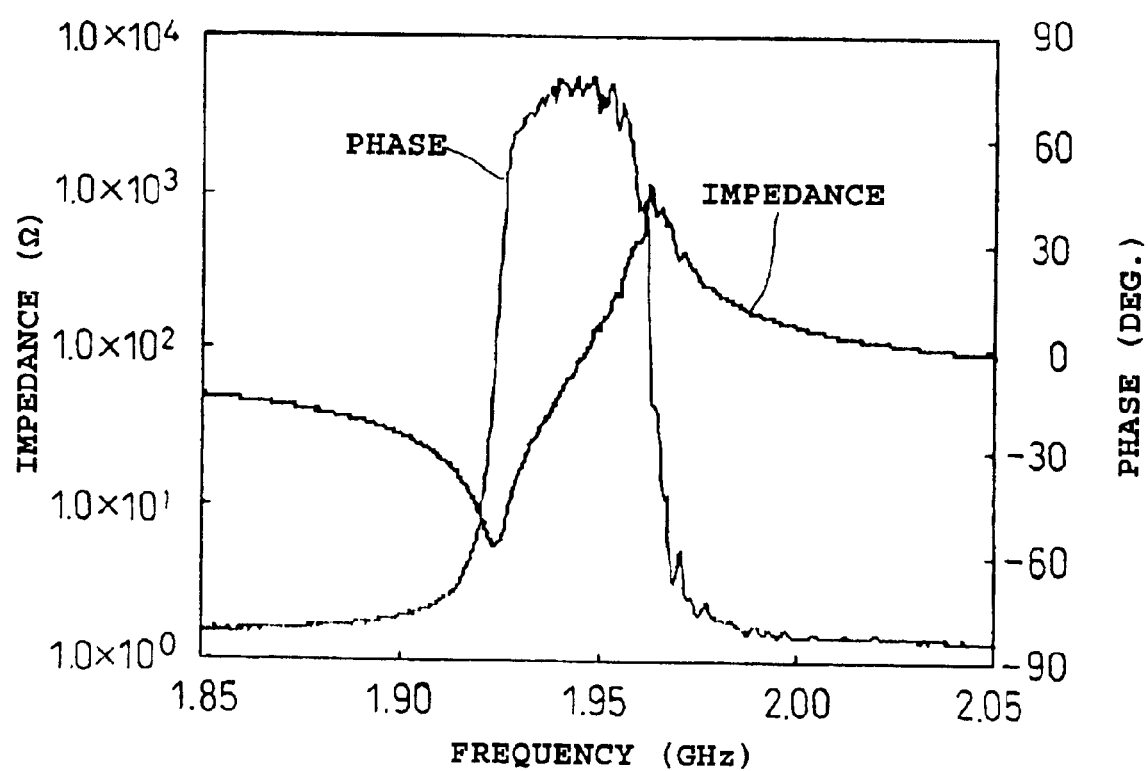
FIG. 21 is a graph illustrating the resonant characteristics of the piezoelectric resonator shown in FIG. 20.

Referring now to FIGS. 1, 20, and 21, a piezoelectric resonator according to a seventh preferred embodiment of the present invention will be described. The piezoelectric resonator according to the seventh preferred embodiment has the same structure as that in the first preferred embodiment, as shown in the vertical sectional view of FIG. 1. Therefore, the shape and other characteristics of the vibrator 7, when viewed in the depth direction and being different from those in the first preferred embodiment, will be described, and the description of the same structure as in the first preferred embodiment is omitted.

As shown in FIG. 20, the shape of the vibrator 7 of the piezoelectric resonator 1 is preferably a trapezoid which is symmetric with respect to a line when viewed in the depth direction. The length L of the shorter one of parallel sides of the trapezoid is preferably substantially equal to or smaller than about 10 times the oscillatory wavelength.

FIG. 21 is a graph illustrating the impedance characteristics and phase characteristics of the piezoelectric resonator. As described above, since the shape of the vibrator 7 is a trapezoid, when viewed in the depth direction, in which the length L of the shorter one of the opposing parallel sides is preferably substantially equal to or smaller than about 10 times the oscillatory wavelength, the systematical shape of the vibrator allows spurious components to be decreased by canceling out each other, thereby leading to favorable characteristics of the piezoelectric resonator with minimal ripples, as shown in FIG. 21.

Eighth Preferred Embodiment

Figure 22:
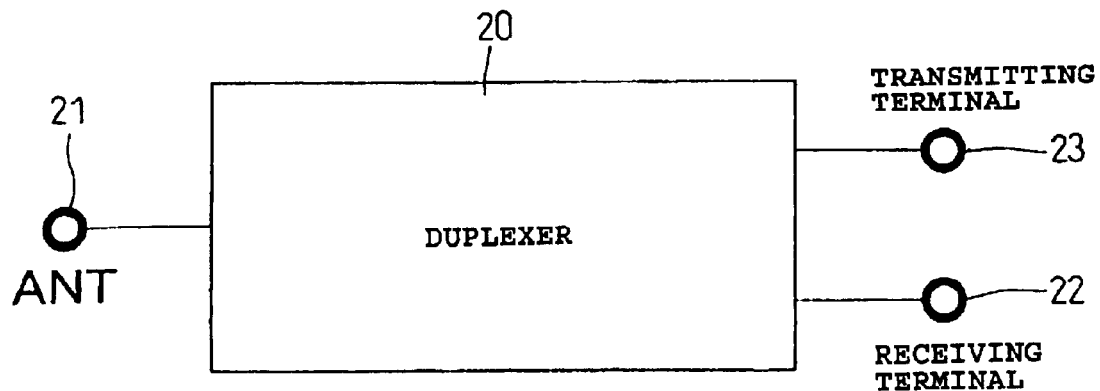
FIG. 22 is a schematic illustration of a duplexer according to a preferred embodiment of the present invention.

Subsequently, a duplexer according to another preferred embodiment of the present invention will be described. A duplexer 20 shown in FIG. 22 has an antenna terminal 21, a receiving terminal 22, and a transmitting terminal 23. The duplexer 20 has a structure in which the piezoelectric resonator according to various preferred embodiments of the present invention or the piezoelectric filter according to various preferred embodiments of the present invention, both allowing signals in a predetermined frequency band range to pass through, is provided as a circuit element between the receiving and transmitting terminals 22 and 23 and the antenna terminal 21. Since the piezoelectric filter functions as a circuit element provided with the piezoelectric resonator according to preferred embodiments of the present invention or with the piezoelectric filter according to preferred embodiments of the present invention defined by the piezoelectric resonator, the duplexer 20 has improved receiving and transmitting characteristics, and improved features.

Ninth Preferred Embodiment

Figure 23:
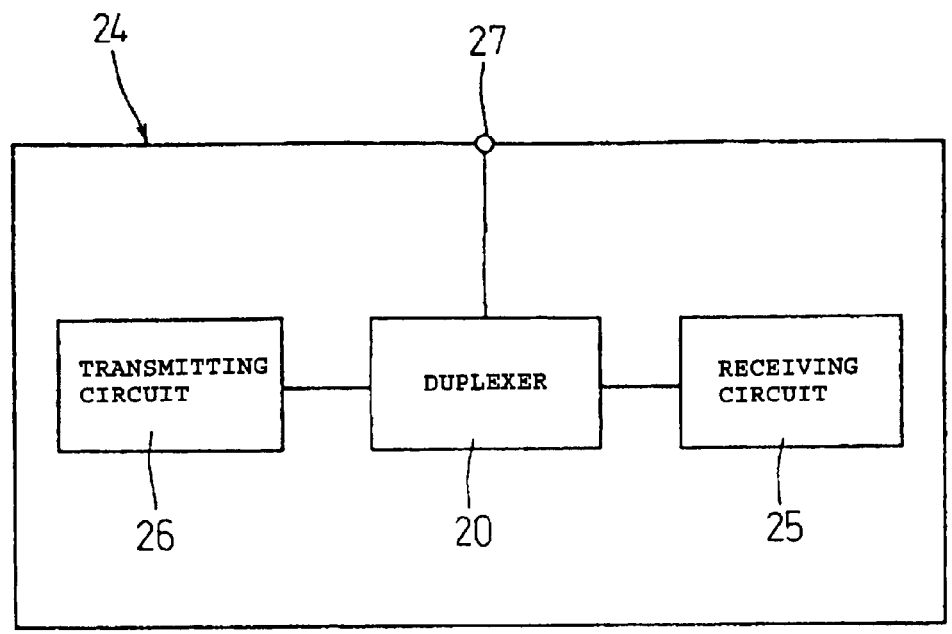
FIG. 23 is a schematic illustration of a communication apparatus according to a preferred embodiment of the present invention.

A communication apparatus according to yet another preferred embodiment of the present invention used as one of a variety of communication devices such as a portable phone terminal and a LAN apparatus will be described. FIG. 23 is a schematic block diagram of the communication apparatus.

As shown in FIG. 23, a communication apparatus 24 has a receiving circuit 25 and a transmitting circuit 26 which are provided in the main body thereof, in addition to having an antenna 27. Also, as described in the eighth preferred embodiment, signals are transmitted between the antenna 27 and the transmitting circuit 26 and between the antenna 27 and the receiving circuit 25 via the duplexer 20. Accordingly, since the piezoelectric resonator according to preferred embodiments of the present invention or the piezoelectric filter according to preferred embodiments of the present invention having the piezoelectric resonator is provided in the duplexer 20 as a circuit element, the communication apparatus has improved transmitting and receiving characteristics, and improved features.

The present invention is not limited to the foregoing preferred embodiments, but various applications and modifications described below by way of examples can be considered.

Although the piezoelectric resonators according to the foregoing preferred embodiments preferably have a resonance frequency close to approximately 1.95 GHz, those skilled in the art will appreciate that the present invention is applicable to a piezoelectric resonator having any resonance frequency greater than 1.95 GHz or smaller than 1.95 GHz.

Figure 24A:
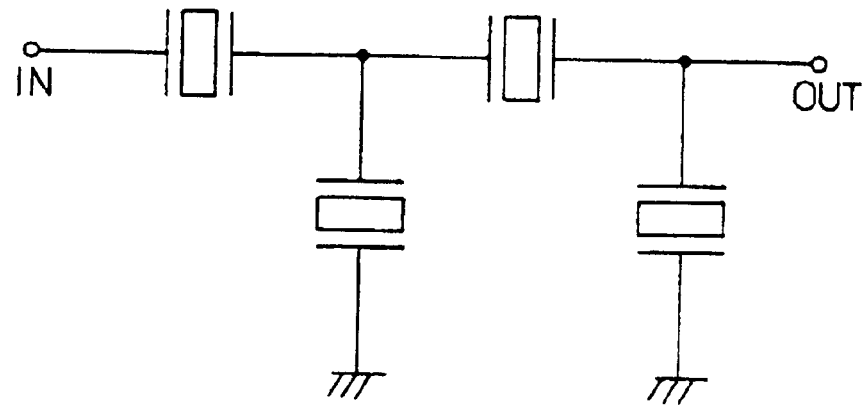
FIGS. 24A to 24C are circuit diagrams representing modified piezoelectric filters having a ladder structure according to a preferred embodiment of the present invention.
Figure 24B:
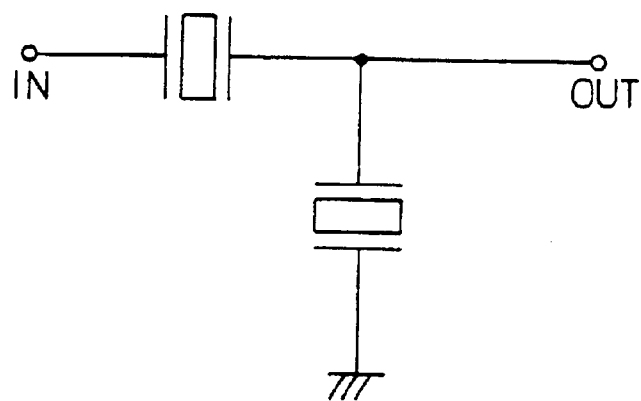
Figure 24C:
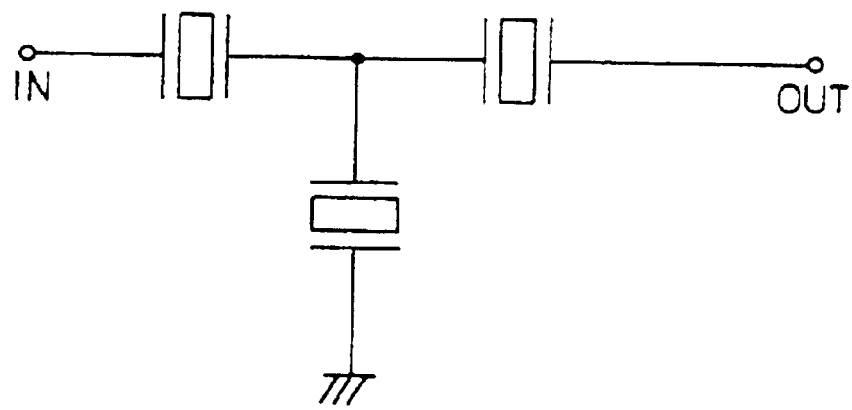

Although the piezoelectric filter according to the second preferred embodiment is preferably an L-type ladder filter, the piezoelectric resonators according to the present invention are applicable to a variety of piezoelectric filters such as a π-type ladder filter shown in FIG. 24A in which two series piezoelectric resonators and two parallel piezoelectric resonators are connected, an L-type ladder filter shown in FIG. 24B in which a parallel piezoelectric resonator is connected between an output terminal and a grounding terminal, and a T-type ladder filter shown in FIG. 24C in which two series piezoelectric resonator and a parallel piezoelectric resonator are connected. Also, although the filter according to the second preferred embodiment has two juxtaposed piezoelectric resonators so as to define a single element, three or more piezoelectric resonators may be arranged to form a single element, and the arrangement of the piezoelectric resonators is not limited to juxtaposition in a given direction.

Although the shape of the vibrator is preferably a long, narrow octagon when viewed in the depth direction in the foregoing preferred embodiments, the vibrator 7 of the piezoelectric resonator according to the present invention may have one of the shapes, when viewed in the depth direction, illustrated in FIGS. 25A to 28B.

Figure 25A:
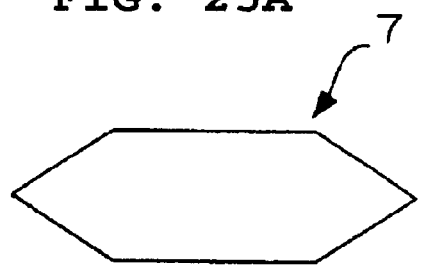
FIGS. 25A to 25E are plan views illustrating the shapes of vibrators, when viewed in the depth direction, of a piezoelectric resonator according to another preferred embodiment of the present invention.
Figure 25B:
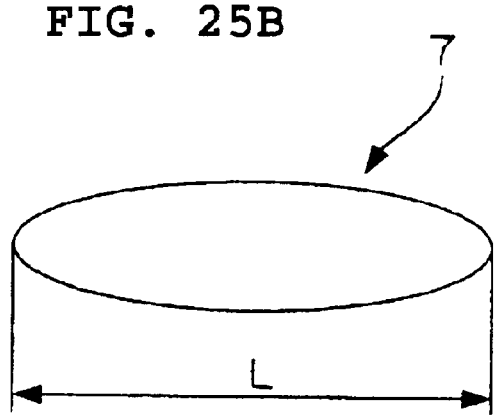
Figure 25D:
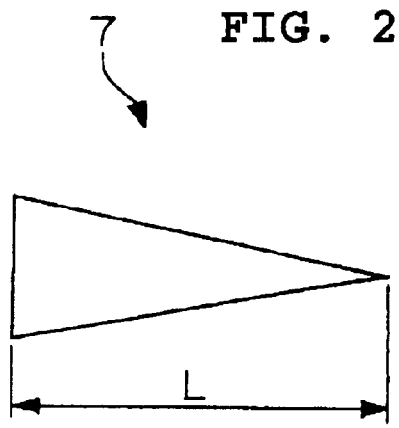
Figure 25C:
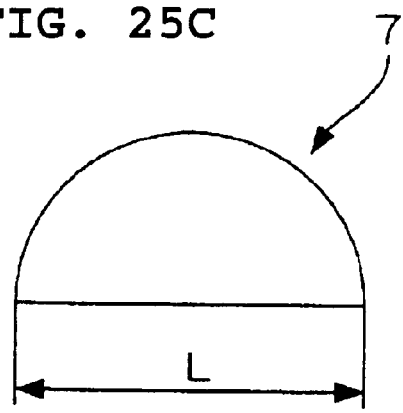
Figure 25E:
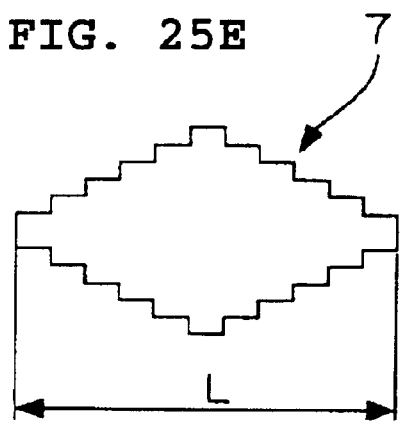

More particularly, FIG. 25A illustrates the vibrator 7 having a laterally long hexagonal shape in which the length of the opposing parallel sides is preferably substantially equal to or smaller than about 10 times the oscillatory wavelength λ. FIG. 25B illustrates the vibrator 7 having a laterally long elliptical shape in which the longitudinal length L is preferably at least about 20 times the oscillatory wavelength λ. FIG. 25C illustrates the vibrator 7 having a semicircular shape in which the longitudinal length L is at least about 20 times the oscillatory wavelength λ. FIG. 25D illustrates the vibrator 7 having an acute-angle isosceles triangular shape in which the longitudinal length L (i.e., the distance L from the base to the top of the triangle) is at least about 20 times the oscillatory wavelength λ. FIG. 25E illustrates the vibrator 7 having a diamond shape, each side having a step-like shape, in which the length of the opposing parallel sides is preferably substantially equal to or smaller than about 10 times the oscillatory wavelength λ and the longitudinal length L is at least about 20 times the oscillatory wavelength λ. When viewed in the depth direction, the shapes of these vibrators shown in FIGS. 25A to 25E are symmetric with respect to a line relative to the corresponding virtual center lines which extend through the centers in the corresponding predetermined width directions and also which are substantially perpendicular to the predetermined width directions.

Figure 26A:
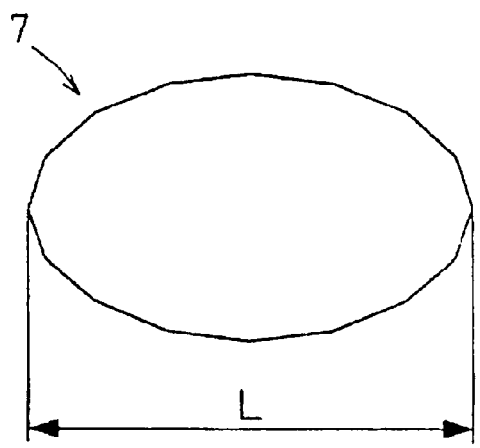
FIGS. 26A to 26D are plan views illustrating the shapes of vibrators, when viewed in the depth direction, of a piezoelectric resonator according to another preferred embodiment of the present invention.
Figure 26C:
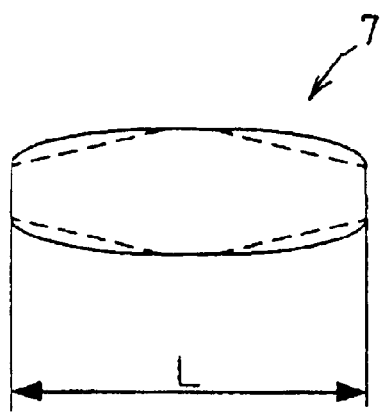
Figure 26B:
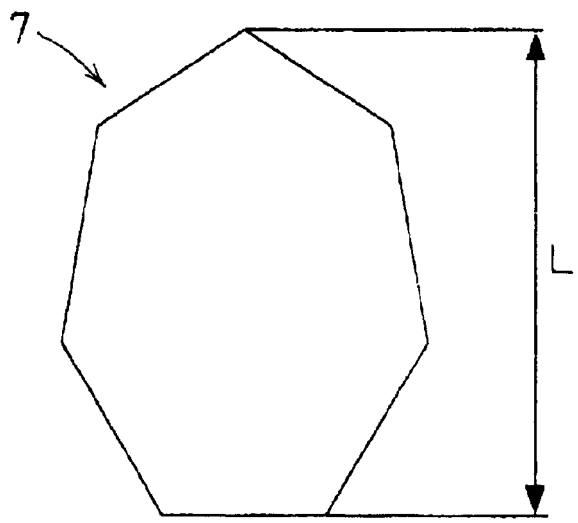
Figure 26D:
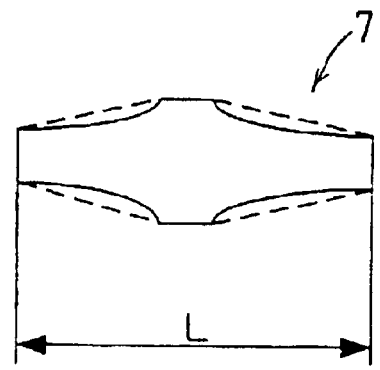

Also, FIG. 26A illustrates the vibrator 7 having a laterally long 16-sided polygonal shape in which the length of the opposing parallel sides is preferably substantially equal to or smaller than about 10 times the oscillatory wavelength λ and the longitudinal length L is at least about 20 times the oscillatory wavelength λ. FIG. 26B illustrates the vibrator 7 having a long, narrow heptagonal shape in which the shape is symmetric with respect to a line and the longitudinal length L is at least about 20 times the oscillatory wavelength λ. FIG. 26C illustrates the vibrator 7 having a long, narrow octagonal shape in which the four sides have convex curves, the length of the opposing parallel sides is preferably substantially equal to or smaller than about 10 times the oscillatory wavelength λ, and the longitudinal length L is at least about 20 times the oscillatory wavelength λ. FIG. 26D illustrates the vibrator 7 having a long, narrow octagonal shape in which the four sides have concave curves, the length of the opposing parallel sides is preferably substantially equal to or smaller than about 10 times the oscillatory wavelength λ, and the longitudinal length L is at least about 20 times the oscillatory wavelength λ. When viewed in the depth direction, the shapes of these vibrators shown in FIGS. 26A to 26D are bilaterally symmetrical with respect to the corresponding virtual center lines which extend through the centers in the corresponding predetermined width directions and also which are substantially perpendicular to the predetermined width directions.

Figure 27A:
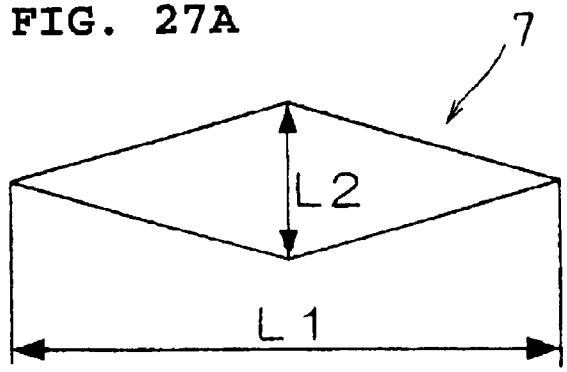
FIGS. 27A to 27C are plan views illustrating the shapes of vibrators, when viewed in the depth direction, of a piezoelectric resonator according to another preferred embodiment of the present invention.
Figure 27B:
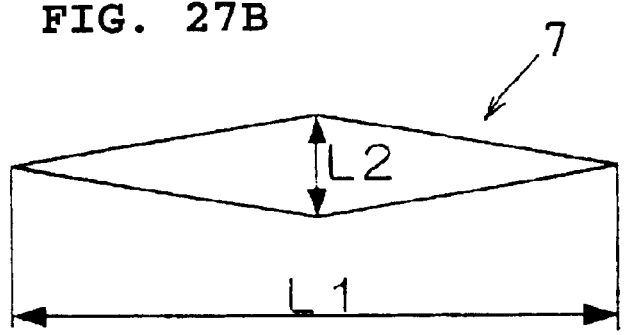
Figure 27C:
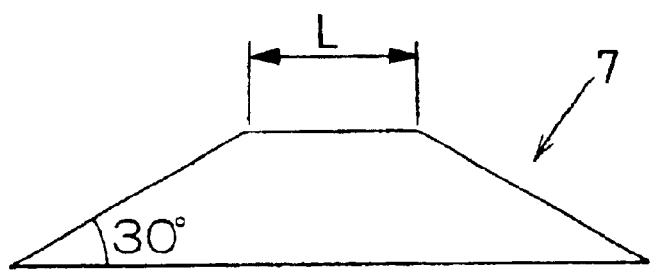

In addition, FIG. 27A illustrates the vibrator 7 having a diamond shape in which the ratio of the longitudinal length L1 with respect to the lateral length L2 is preferably approximately 11:3 and the length of the opposing parallel sides is preferably substantially equal to or smaller than about 10 times the oscillatory wavelength λ. FIG. 27B illustrates the vibrator 7 having a diamond in which the ratio of the longitudinal length L1 with respect to the lateral length L2 is preferably approximately 6:1 and the length of opposing parallel sides is substantially equal to or smaller than about 10 times the oscillatory wavelength λ. FIG. 27C illustrates the vibrator 7 having a trapezoid in which the apex angle is preferably about 30° and the length of the upper side is preferably substantially equal to or smaller than about 10 times the oscillatory wavelength λ. When viewed in the depth direction, the shapes of these vibrators shown in FIGS. 27A to 27D are symmetric with respect to a line relative to the corresponding virtual center lines which extend through the centers in the corresponding predetermined width directions and also which are substantially perpendicular to the predetermined width directions.

Figure 28A:
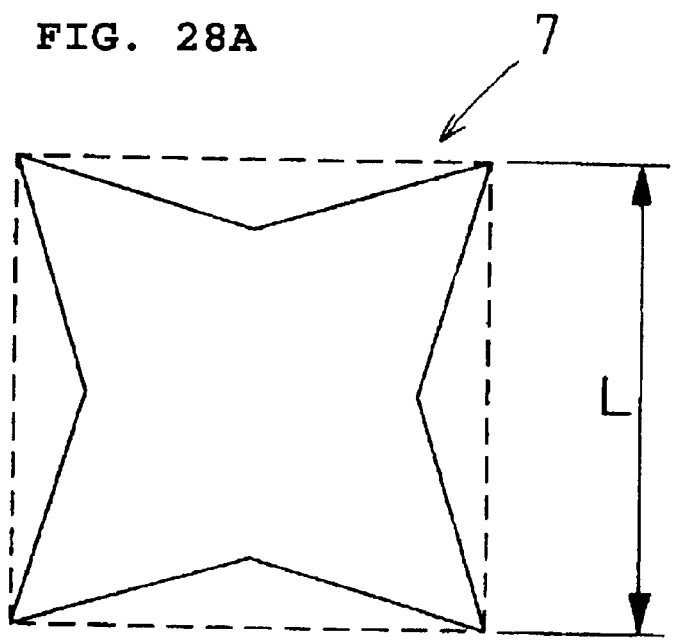
FIGS. 28A and 28B are plan views illustrating the shapes of vibrators, when viewed in the depth direction, of a piezoelectric resonator according to another preferred embodiment of the present invention.
Figure 28B:
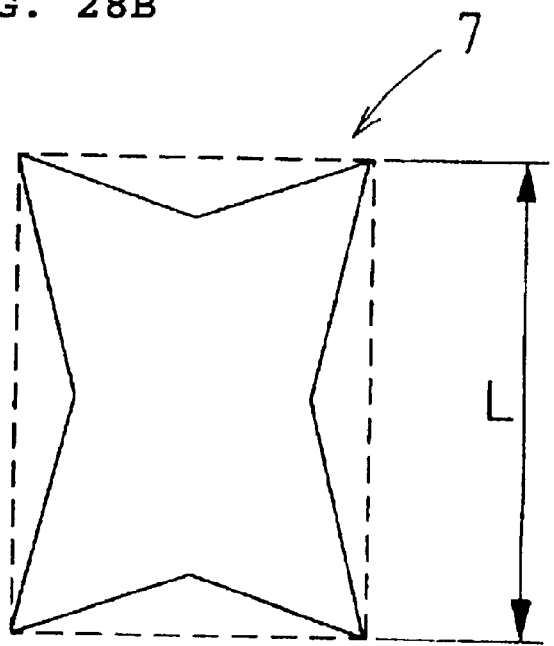

Furthermore, FIG. 28A illustrates the vibrator 7 having a shape that is formed by cutting out an obtuse-angle isosceles triangle from each side of a square toward the inside of the square, in which the longitudinal length L (i.e., the length L of each side of the square) is preferably substantially at least about 20 times the oscillatory wavelength λ. FIG. 28B illustrates the vibrator 7 having a shape, formed by cutting out an obtuse-angle isosceles triangle from each side of a rectangle toward the inside of the rectangle, in which the longitudinal length L (i.e., the length L of the long side of the rectangle) is preferably substantially at least about 20 times the oscillatory wavelength λ. When viewed in the depth direction, the shapes of these vibrators shown in FIGS. 28A to 28B are symmetric with respect to a line relative to the corresponding virtual center lines which extend through the centers in the corresponding predetermined width directions and also which are substantially perpendicular to the predetermined width directions.

Figure 29A:
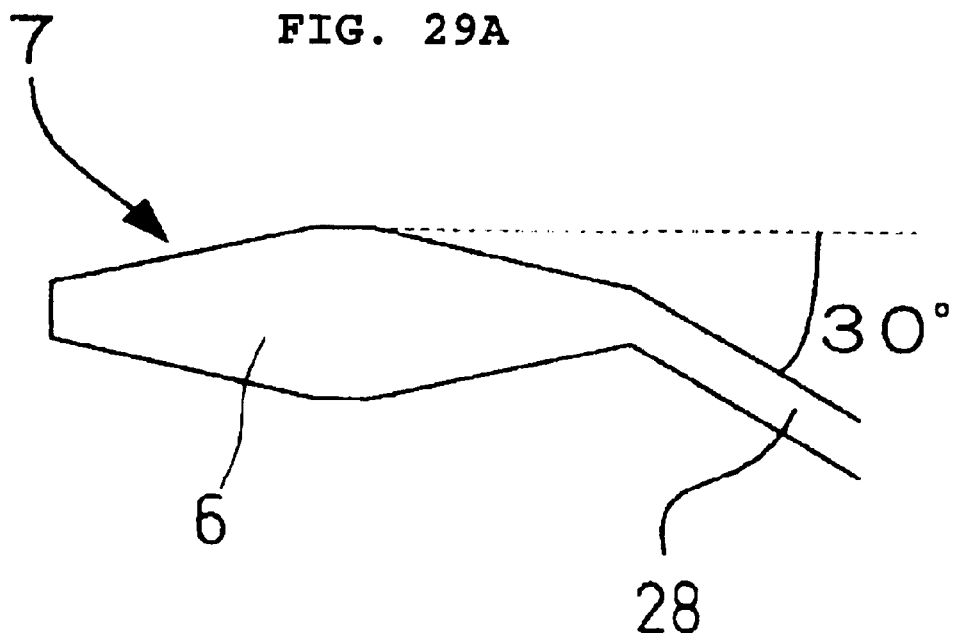
FIGS. 29A and 29B are plan views illustrating the vibrator and a lead.
Figure 29B:
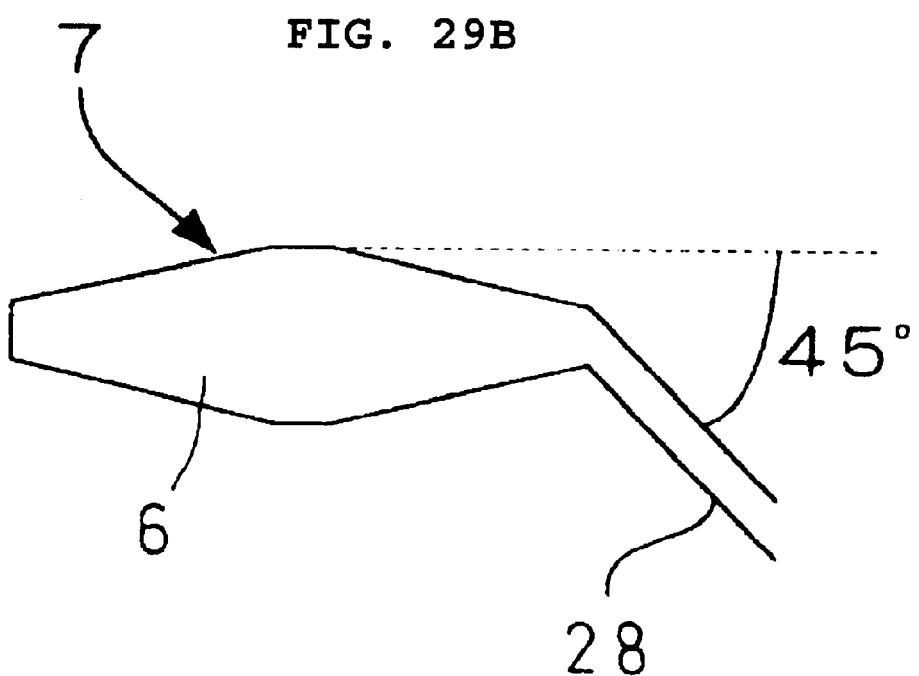

Although a lead for mutually connecting the upper electrode and the external electrode is arranged so as to be connected to the upper electrode while extending along the longitudinal direction of the vibrator in the foregoing preferred embodiments, a lead 28 may be connected to the upper electrode 6 while extending along a direction at an angle with the longitudinal direction of the upper electrode 6 of the vibrator 7, as shown in FIGS. 29A and 29B. FIG. 29A illustrates a structure in which the lead 28 extends along a direction at an angle of about 30° with the longitudinal direction and FIG. 29B illustrates another structure in which the lead 28 extends along a direction at an angle of 45° with the longitudinal direction. Since the lead 28 extends at an angle with the longitudinal direction of the vibrator as described above, the overall necessary length of an element in the longitudinal direction of the vibrator can be made small, thereby leading to a reduced size of the element.

Figure 30:
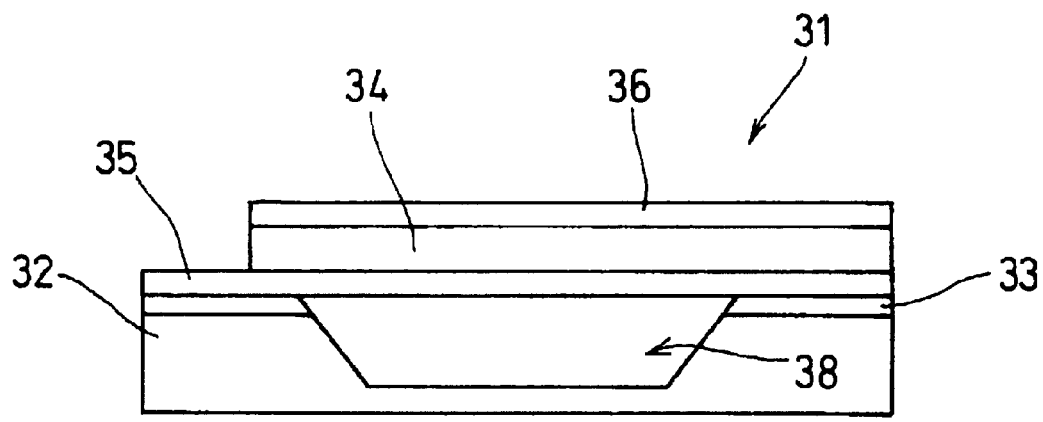
FIG. 30 is a vertical sectional view of a piezoelectric resonator according to another preferred embodiment of the present invention.
Figure 31:
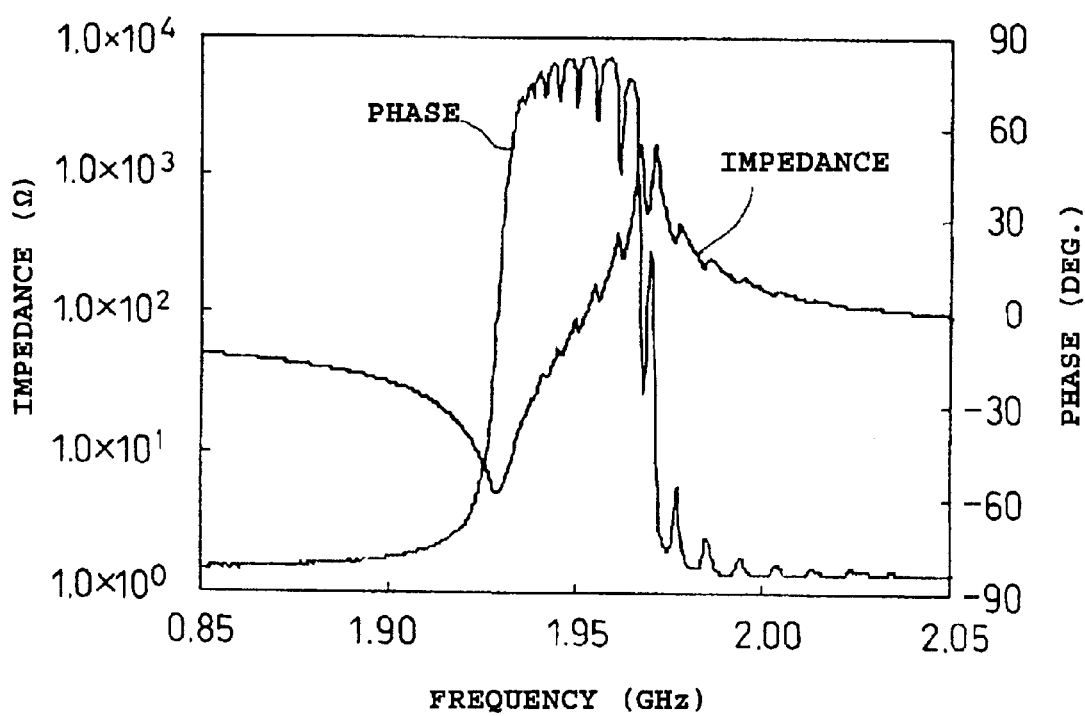
FIG. 31 is a graph illustrating the resonant characteristics of a known piezoelectric resonator.
Figure 32:
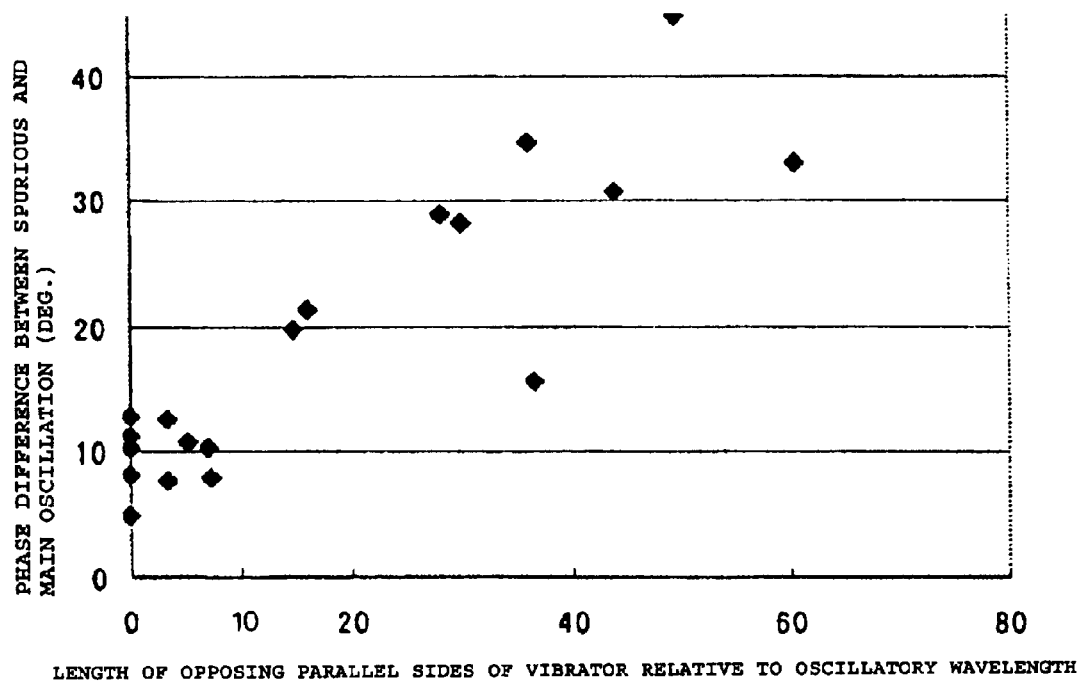
FIG. 32 is a graph illustrating the relationships between the length of opposing parallel sides of the shape, when viewed in the depth direction, of the vibrator of the piezoelectric resonator relative to the oscillatory wavelength and the phase difference between a spurious component and the main oscillation.

Although the opening is arranged so as to vertically extend through the substrate and the vibrator is disposed in the opening in the foregoing preferred embodiments, a piezoelectric resonator 31 according to a preferred embodiment of the present invention may have a structure in which, for example, as shown in FIG. 30, a substrate 32 has a depression 38 on the upper surface thereof so as to form a cavity having a bottom, a lower electrode 35 so as to cover the depression 38 via an insulating layer 33, and an upper electrode 36 on a piezoelectric thin-film 34 formed on the lower electrode 35.

While the present invention has been described with reference to what are at present considered to be the preferred embodiments, it is to be understood that various changes and modifications may be made thereto without departing from the present invention in its broader aspects and therefore, it is intended that the appended claims cover all such changes and modifications that fall within the true spirit and scope of the invention.

What is claimed is:

1. A piezoelectric resonator comprising:
    a substrate; and
    a vibrator including:
        a thin-film portion including at least one piezoelectric thin-film layer disposed on the substrate; and
        at least one pair of upper and lower electrodes disposed on the substrate;

wherein the vibrator has a structure in which the thin-film portion is sandwiched between the upper and lower surfaces of the vibrator by the upper and lower electrodes, which oppose each other in the depth direction of the vibrator; and an overlapping portion of the vibrator defined by the opposing upper and lower electrodes has a tetragonal shape, when viewed in the depth direction of the substrate, other than a rectangle and a square, the tetragonal shape having substantially parallel sides having a longitudinal length that is substantially equal to or smaller than about 10 times the oscillatory wavelength and having at least one portion in which the distance between opposing electrode edges varies.

2. A piezoelectric resonator comprising:
a substrate; and
a vibrator including:
a thin-film portion including at least one piezoelectric thin-film layer disposed on the substrate; and
at least one pair of upper and lower electrodes disposed on the substrate;
wherein the vibrator has a structure in which the thin-film portion is sandwiched between the upper and lower surfaces of the vibrator by the upper and lower electrodes, which oppose each other in the depth direction of the vibrator; and
an overlapping portion of the vibrator defined by the opposing upper and lower electrodes has a polygonal shape having at least five sides, when viewed in the depth direction, the polygonal shape having substantially parallel sides having a longitudinal length that is substantially equal to or smaller than about 10 times the oscillatory wavelength and having at least one portion in which the distance between opposing electrode edges varies.

3. The piezoelectric resonator according to claim 1, wherein the overlapping portion of the vibrator defined by the opposing upper and lower electrodes is symmetric with respect to a line when viewed in the depth direction.

4. The piezoelectric resonator according to claim 2, wherein the overlapping portion of the vibrator defined by the opposing upper and lower electrodes is symmetric with respect to a line when viewed in the depth direction.

5. The piezoelectric resonator according to claim 1, wherein the overlapping portion of the vibrator defined by the opposing upper and lower electrodes is symmetric with respect to a point when viewed in the depth direction.

6. The piezoelectric resonator according to claim 2, wherein the overlapping portion of the vibrator defined by the opposing upper and lower electrodes is symmetric with respect to a point when viewed in the depth direction.

7. The piezoelectric resonator according to claim 2, wherein the shape of the overlapping portion of the vibrator defined by the opposing upper and lower electrodes is an octagon when viewed in the depth direction.

8. The piezoelectric resonator according to claim 7, wherein the shape of the overlapping portion of the vibrator defined by the opposing upper and lower electrodes is an elongated octagon when viewed in the depth direction.

9. The piezoelectric resonator according to claim 8, wherein, when viewed in the depth direction, the overlapping portion of the vibrator defined by the opposing upper and lower electrodes has a shape in which, when the lateral length is defined as b and the length of lateral sides at the longitudinal ends is defined as d, the relationship $d/b \leq 0.5$ is satisfied.

10. The piezoelectric resonator according to claim 1, wherein the shape of the overlapping portion of the vibrator defined by the opposing upper and lower electrodes is a diamond when viewed in the depth direction.

11. The piezoelectric resonator according to claim 1, wherein the shape of the overlapping portion of the vibrator defined by the opposing upper and lower electrodes is a trapezoid when viewed in the depth direction.

12. The piezoelectric resonator according to claim 1, wherein the overlapping portion of the vibrator defined by the opposing upper and lower electrodes has a longitudinal length that is equal to or greater than about 20 times the resonant wavelength of the main oscillation.

13. The piezoelectric resonator according to claim 1, wherein the substrate has one of an opening and a depression, and the vibrator is disposed above the one of the opening and the depression.

14. The piezoelectric resonator according to claim 1, wherein the vibrator oscillates in a thickness longitudinal oscillation mode in response to electrical signals being applied to the upper and lower electrodes.

15. A piezoelectric filter comprising the piezoelectric resonator according to claim 1.

16. A piezoelectric filter having a ladder structure and comprising a piezoelectric resonator according to claim 1.

17. A duplexer comprising the piezoelectric resonator according to claim 1.

18. A communication apparatus comprising a piezoelectric resonator according to claim 1.

19. A piezoelectric resonator comprising:
a substrate; and
a vibrator including:
a thin-film portion including at least one piezoelectric thin-film layer disposed on the substrate; and
at least one pair of upper and lower electrodes disposed on the substrate; wherein
the vibrator has a structure in which the thin-film portion is sandwiched between the upper and lower surfaces of the vibrator by the upper and lower electrodes, which oppose each other in the depth direction of the vibrator;
an overlapping portion of the vibrator defined by the opposing upper and lower electrodes has no pair of parallel sides and is symmetric with respect to a line when viewed in the depth direction; and
the overlapping portion of the vibrator defined by the opposing upper and lower electrodes has a longitudinal length that is equal to or greater than about 20 times the resonant wavelength of the main oscillation.

20. The piezoelectric resonator according to claim 19, wherein the substrate has one of an opening and a depression, and the vibrator is disposed above the one of the opening and the depression.

21. The piezoelectric resonator according to claim 19, wherein the vibrator oscillates in a thickness longitudinal oscillation mode in response to electrical signals being applied to the upper and lower electrodes.

22. A piezoelectric filter comprising the piezoelectric resonator according to claim 19.

23. A piezoelectric filter having a ladder structure and comprising a piezoelectric resonator according to claim 19.

24. A duplexer comprising the piezoelectric resonator according to claim 19.

25. A communication apparatus comprising a piezoelectric resonator according to claim 19.

26. The piezoelectric resonator according to claim 19, wherein the shape of the overlapping portion of the vibrator defined by the opposing upper and lower electrodes is an isosceles triangle when viewed in the depth direction.

27. The piezoelectric resonator according to claim 19, wherein the shape of the overlapping portion of the vibrator defined by the opposing upper and lower electrodes is a heptagon when viewed in the depth direction.

* * * * *